United States Patent
Kondo et al.

(10) Patent No.: US 9,859,684 B2
(45) Date of Patent: *Jan. 2, 2018

(54) GRATING ELEMENT AND EXTERNAL-RESONATOR-TYPE LIGHT EMITTING DEVICE

(71) Applicant: NGK INSULATORS, LTD., Aichi-prefecture (JP)

(72) Inventors: Jungo Kondo, Miyoshi (JP); Shoichiro Yamaguchi, Ichinomiya (JP); Tetsuya Ejiri, Kasugai (JP); Keiichiro Asai, Nagoya (JP); Naotake Okada, Anjo (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/163,221

(22) Filed: May 24, 2016

(65) Prior Publication Data
US 2016/0344161 A1    Nov. 24, 2016

Related U.S. Application Data

(63) Continuation of application No. PCT/JP2014/080478, filed on Nov. 18, 2014.

(30) Foreign Application Priority Data

Nov. 27, 2013  (JP) .................................. 2013-244538

(51) Int. Cl.
*H01S 5/14*     (2006.01)
*G02B 5/18*     (2006.01)
*G02B 6/124*    (2006.01)

(52) U.S. Cl.
CPC ............ *H01S 5/141* (2013.01); *G02B 5/1814* (2013.01); *G02B 6/124* (2013.01); *H01S 5/14* (2013.01)

(58) Field of Classification Search
CPC .......... H01S 5/125; H01S 5/141; G02B 6/124
See application file for complete search history.

(56) References Cited

U.S. PATENT DOCUMENTS 6,320,888 B1    11/2001  Tanaka et al.
7,424,044 B2     9/2008  Zheng et al.
(Continued)

FOREIGN PATENT DOCUMENTS

JP    49-128689 A    12/1974
JP    56-148880 A    11/1981
(Continued)

OTHER PUBLICATIONS

Tanaka, "Hybrid-integrated external-cavity laser without temperature-dependent mode hopping" Journal of Lightwave Technology, vol. 20, No. 9, Sep. 2002.*

(Continued)

*Primary Examiner* — Michael Carter
(74) *Attorney, Agent, or Firm* — Cermak Nakajima & McGowan LLP; Tomoko Nakajima

(57) ABSTRACT

A grating device includes a support substrate, an optical material layer 11 disposed on the support substrate and having a thickness of 0.5 µm or more and 3.0 µm or less, a ridge optical waveguide formed by a pair of ridge grooves in the optical material layer and having a light-receiving surface for receiving a semiconductor laser light and a light-emitting surface for emitting light having a desired wavelength, a Bragg grating 12 comprising convexes and concaves formed in the ridge optical waveguide, and a propagating portion 13 disposed between the light-receiving (Continued)

surface and the Bragg grating. The relationships represented by the following Formulas (1) to (4) are satisfied:

$$0.8 \text{ nm} \leq \Delta\lambda G \leq 6.0 \text{ nm} \quad (1);$$

$$10 \text{ μm} \leq Lb \leq 300 \text{ μm} \quad (2);$$

$$20 \text{ nm} \leq td \leq 250 \text{ nm} \quad (3); \text{ and}$$

$$nb \geq 1.8 \quad (4).$$

9 Claims, 17 Drawing Sheets

(56) References Cited

U.S. PATENT DOCUMENTS

| | | | |
|---|---|---|---|
| 8,867,577 | B2 | 10/2014 | Fukaya et al. |
| 9,184,564 | B2 | 11/2015 | Kondo et al. |
| 9,331,454 | B2 | 5/2016 | Kondo et al. |
| 2001/0021210 | A1 | 9/2001 | Nakaya et al. |
| 2004/0020893 | A1* | 2/2004 | Drake .................... G02B 6/124 216/3 |
| 2006/0109542 | A1 | 5/2006 | Mizuuchi et al. |
| 2009/0116802 | A1 | 5/2009 | Kondou et al. |
| 2012/0099611 | A1* | 4/2012 | Kim ...................... H01S 5/141 372/20 |
| 2016/0313145 | A1* | 10/2016 | Kondo .................... G02B 6/124 |

FOREIGN PATENT DOCUMENTS

| | | |
|---|---|---|
| JP | 02-154476 A | 6/1990 |
| JP | 05-257184 A | 10/1993 |
| JP | 10-098230 A | 4/1998 |
| JP | 11-097784 A | 4/1999 |
| JP | 2000-082864 A | 3/2000 |
| JP | 2001 257422 A | 9/2001 |
| JP | 2002-134833 A | 5/2002 |
| JP | 2004-219751 A | 8/2004 |
| JP | 3667209 B2 | 4/2005 |
| JP | 2005-142400 A | 6/2005 |
| JP | 2006-222399 A | 8/2006 |
| JP | 2007-264487 A | 10/2007 |
| JP | 2010-171252 A | 8/2010 |
| JP | 2013-120999 A | 6/2013 |
| JP | 2013-140225 A | 7/2013 |
| WO | WO2013/034813 A2 | 3/2013 |

OTHER PUBLICATIONS

Yamada, K., et al., "Highly Accurate Wavelength Control of External Cavity Laser Module with Fiber Grating," IEICE Transactions on Fundamental of Electronics, Communications and Computer Sciences, C-II, vol. J81, No. 7, pp. 664-665, Jul. 1998.
IEICE Technical Report LQE, 2005, vol. 105, No. 52, pp. 17-20.
International Search Report and Written Opinion for PCT Patent App. No. PCT/JP2014/080478 (dated Feb. 24, 2015) with English translation of ISR.
Office Action from Japanese Patent App. No. 2015-528735 dated Aug. 24, 2015.
Office Action from Japanese Patent App. No. 2015-528735 dated Dec. 22, 2015.
Co-pending U.S. Appl. No. 14/958,241, filed Dec. 3, 2015. See attached List of Potentially Related Pending Applications.
Co-pending U.S. Appl. No. 15/165,004, filed May 26, 2016. See attached List of Potentially Related Pending Applications.
Extended European Search Report for PCT Patent App. No. 14865392.6 (dated Jun. 12, 2017).

\* cited by examiner

Fig. 9
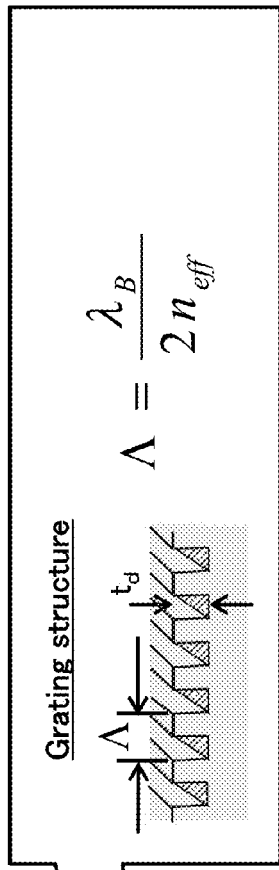
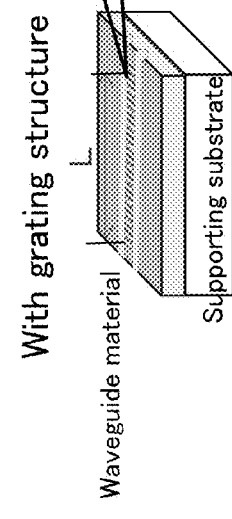
$$\Lambda = \frac{\lambda_B}{2n_{eff}}$$
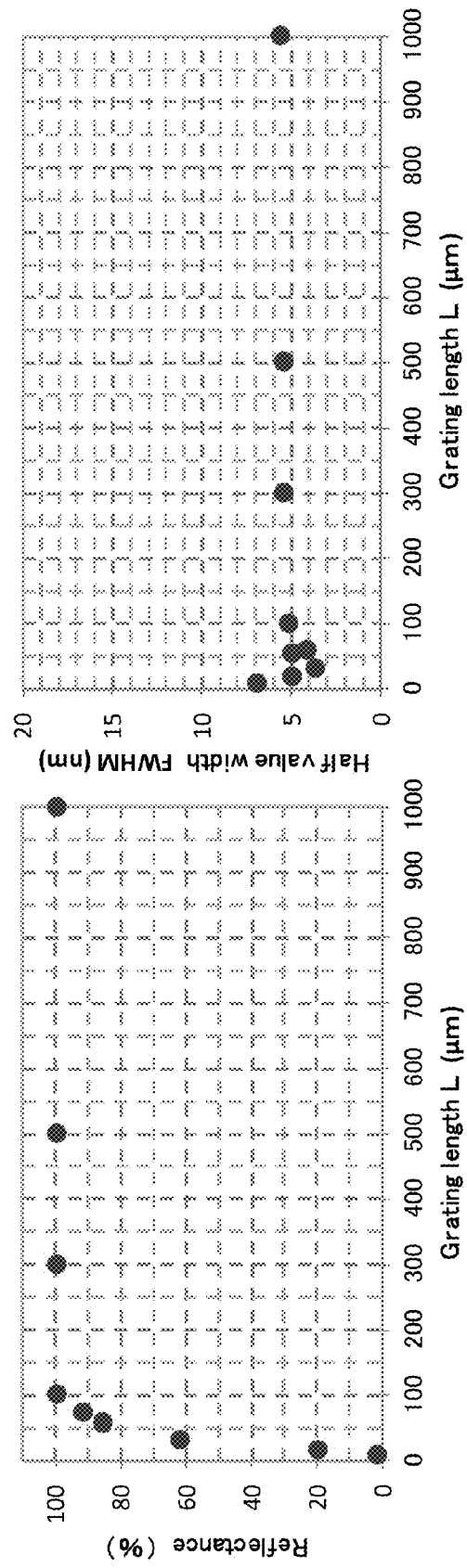

Fig. 10
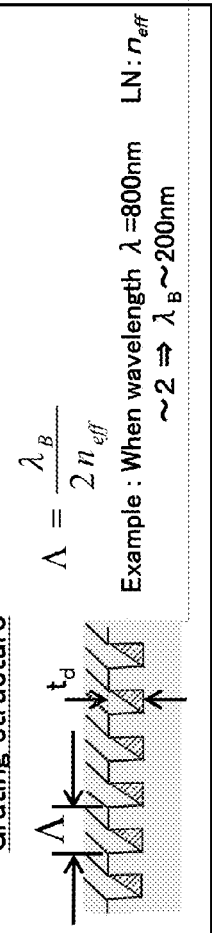
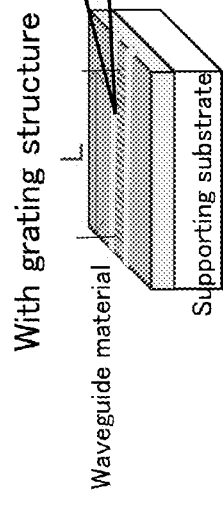
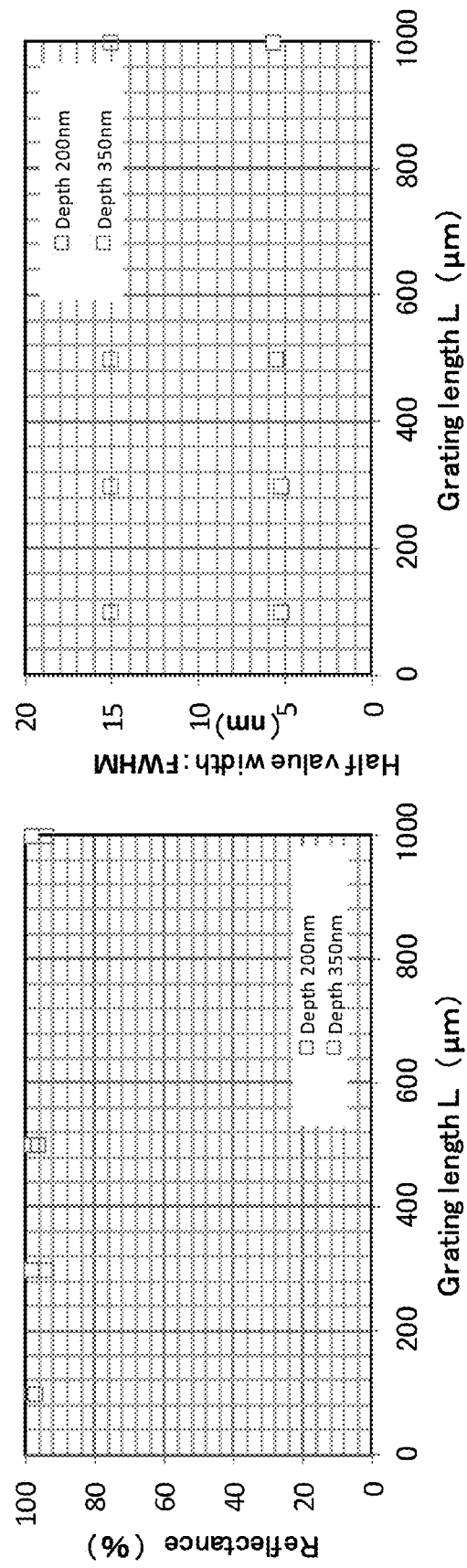

GRATING ELEMENT AND EXTERNAL-RESONATOR-TYPE LIGHT EMITTING DEVICE

TECHNICAL FIELD

The present invention relates to a grating device and an external resonator type light emitting system that uses the grating device.

BACKGROUND ARTS

Generally, semiconductor lasers having Fabry-Perot (FP) resonator configuration are used, the resonator being formed by mirrors on the both end faces of an active layer. However, the FP lasers produce laser light at a wavelength that satisfies conditions for forming standing waves. Thus, the lasers tend to operate in a multi-longitudinal mode. Particularly as the current and the temperature changes, the laser oscillation wavelength varies, which results in a change in optical intensity.

Thus, in applications in optical communication, gas sensing, and the like, there has been a need for a laser that exhibits high wavelength stability and that operates in a single mode. Thus, distributed feed-back (DFB) lasers and distributed reflection (DBR) lasers have been developed. These lasers include a grating in a semiconductor element and produce only laser light having a specific wavelength by using the wavelength dependency of the grating.

Examples of semiconductor lasers that exhibit wavelength stability can include DBR lasers and DFB lasers having a grating that is monolithically formed in the semiconductor laser and external resonator lasers having a fiber grating (FBG) grating disposed on the exterior of the laser. The principle of these lasers is that a part of laser light is returned to the lasers by wavelength-selective mirrors that use Bragg reflection to achieve wavelength stable operation.

DBR lasers include ridges and grooves that are formed in a surface of a waveguide lying on the same straight line as a waveguide in the active layer and mirrors that uses Bragg reflection for realizing a resonator (Patent Document 1 (Japanese Unexamined Patent Application Publication No. S49-128689A) and Patent Document 2 (Japanese Unexamined Patent Application Publication No. S56-148880A)). These lasers include a grating on the both end surfaces of the optical waveguide layer. Thus, light emitted by the active layer is propagated through the optical waveguide layer, and a part of the light is reflected by the grating and is returned to the current injection portion, where the light is amplified. Only light having a single wavelength is reflected by the grating in a predetermined direction, and thus laser light has a constant wavelength.

As an application of such lasers, external resonator semiconductor lasers that include the grating as a separate component from a semiconductor element to form an external resonator have been developed. This type of lasers exhibit good wavelength stability, temperature stability, and controllability. Examples of the external resonator include fiber Bragg gratings (FBG) (Non-Patent Document 1) and volume holographic gratings (VHG) (Non-Patent Document 2). The gratings are configured to be a separate component from the semiconductor lasers, and thus the lasers are characterized in that the reflectance and the resonator length can be independently designed. As the gratings are not affected by temperature rise due to heat generation caused by current injection, the wavelength stability can be further improved. As the semiconductor material has a different temperature dependency of the refractive index, the temperature stability can be improved by designing the refractive index together with the length of the resonator.

Patent Document 6 (Japanese Unexamined Patent Application Publication No. 2002-134833A) discloses an external resonator laser that uses a grating formed in a silica glass waveguide. The patent is to provide a frequency-stable laser that can be used, without a temperature controller, in an environment in which room temperature significantly changes (for example 30° C. or more). The patent describes provision of a temperature-independent laser that prevents mode hopping and that does not depend on temperature for laser oscillation frequency.

Patent Document 8 (Japanese Unexamined Patent Application Publication No. 2010-171252A) discloses an external resonator laser that includes an optical waveguide having a core layer of $SiO_2$, $SiO_{1-x}N_x$ (wherein x is from 0.55 to 0.65), or Si and SiN and a grating formed on the optical waveguide. The external resonator laser maintains a constant laser oscillation wavelength without precise temperature-control and presupposes that a change in reflection wavelength with temperature (temperature coefficient of the Bragg reflection wavelength) of the grating is decreased. Based on this, the patent describes that operation of the laser in a multi-longitudinal mode can provide power stability.

Patent Document 9 (Japanese Patent No. 3667209B) discloses an external resonator laser that uses a grating formed in an optical waveguide of quartz, InP, GaAs, $LiNbO_3$, $LiTaO_3$, or polyimide resin. The patent described that the reflectance of the light-emitting surface of the semiconductor laser, which is a light source, is the effective reflectance $R_e$ (substantially from 0.1 to 38.4%), and that based on this, operation of the laser in a multi and longitudinal mode can provide power stability.

RELATED ART DOCUMENTS

Patent Documents

Patent Document 1: Japanese Unexamined Patent Application Publication No. S49-128689A
Patent Document 2: Japanese Unexamined Patent Application Publication No. S56-148880A
Patent Document 3: WO2013/034813 A1
Patent Document 4: Japanese Unexamined Patent Application Publication No. 2000-082864A
Patent Document 5: Japanese Unexamined Patent Application Publication No. 2006-222399A
Patent Document 6: Japanese Unexamined Patent Application Publication No. 2002-134833A
Patent Document 7: Japanese Patent Application No. 2013-120999
Patent Document 8: Japanese Unexamined Patent Application Publication No. 2010-171252A
Patent Document 9: Japanese Patent No. 3667209B

Non-Patent Documents

Non-Patent Document 1: IEICE Transactions on Fundamentals of Electronics, Communications and Computer Sciences, C-II, Vol. J81, No. 7, pp. 664-665, July, 1998
Non-Patent Document 2: IEICE Technical Report LQE, 2005, Vol. 105, No. 52, pp. 17-20
Non-Patent Document 3: Furukawa Review, January 2000, No. 105, p 24-29

SUMMARY OF THE INVENTION

Non-Patent Document 1 describes the mechanism of mode hopping that impairs wavelength stability due to temperature rise and its remedy. The wavelength change $\delta\lambda s$ with temperature of an external resonator laser is represented by the following formula based on standing wave conditions. In the formula, $\Delta na$ is the refractive index change of the active layer region of the semiconductor, La is the length of the active layer, $\Delta nf$ is the refractive index change of the FBG region, Lf is the length of the FBG region, $\delta Ta$ is the temperature change of the active layer region, and $\delta Tf$ is the temperature change of the FBG region.

$$\delta\lambda_s = \lambda_0 \frac{\Delta n_a L_a}{n_f L_f + n_a L_a} \delta T_a + \lambda_0 \frac{\Delta n_f L_f}{n_f L_f + n_a L_a} \delta T_f \quad \text{[Formula 1]}$$

In the formula, $\lambda 0$ represents the reflection wavelength of the grating in the initial state.

The change $\delta\lambda G$ in reflection wavelength of the grating is represented by the following formula:

$$\delta\lambda_G = \lambda_0 \frac{\Delta n_f}{n_f} \delta T_f \quad \text{[Formula 2]}$$

A mode hop occurs when the longitudinal mode spacing $\Delta\lambda$ of the external resonator is equal to the difference between the wavelength change $\delta\lambda s$ and the reflection wavelength change $\delta\lambda G$ of the grating, and thus the following formula is obtained:

$$\Delta\lambda = \delta\lambda_s - \lambda_0 \frac{\Delta n_f}{n_f} \delta T_f \quad \text{[Formula 3]}$$

The longitudinal mode spacing $\Delta\lambda$ is approximately represented by the following formula:

$$\Delta\lambda = \frac{\lambda_0^2}{2(n_f L_f + n_a L_a)} \quad \text{[Formula 4]}$$

From the Formula 3 and the Formula 4, a Formula 5 is obtained.

$$\Delta T_{all} = \frac{\lambda_0}{2 n_a L_a \left( \frac{\Delta n_a}{n_a} - \frac{\Delta n_f}{n_f} \right)} \quad \text{[Formula 5]}$$

To prevent mode hopping, the laser needs to be used at a temperature of $\Delta$Tall or lower, and the temperature is controlled by a Peltier element. In the Formula 5, when the active layer and the grating layer have the same refractive index change ($\Delta na/na = \Delta nf/nf$), the denominator is zero, and the temperature at which a mode hop occurs is infinite, which indicates that any mode hop would not occur. However, in monolithic DBR lasers, current is injected into the active layer for laser oscillation, and thus the active layer and the grating layer cannot have the same refractive index change, which causes mode hopping.

The mode hopping is the phenomenon in which the laser oscillation mode (longitudinal mode) within the resonator is shifted from one mode to another mode. As the temperature or injection current changes, the conditions of the gain and the resonator are changed, and then the laser oscillation wavelength varies, which causes the problem, called kink, that the optical power fluctuates. Thus, in the case of FP GaAs semiconductor lasers, the wavelength normally changes at a temperature coefficient of 0.3 nm/° C., while the wavelength would change more significantly when a mode hope occurs. At the same time, the output changes by 5 percent or more.

Thus, a Peltier device is used to control the temperature in order to prevent mode hopping. However, this increases the number of components, the size of the module, and the cost.

In the Patent Document 6, temperature independence is achieved by applying stress to the optical waveguide layer to compensate for the temperature coefficient due to thermal expansion while the conventional resonator structure is maintained. Thus, a metal plate is adhered onto the element, and a layer for adjusting the temperature coefficient is added into the waveguide. This causes the problem that the size of the resonator structure is further increased.

In the Patent Document 7, the inventors of the present invention disclosed an external resonator laser structure that uses an optical waveguide grating device. In the application, when the full width at half maximum $\Delta\lambda_G$ of the reflective characteristics of the grating device satisfies a predetermined formula, the structure can produce laser light with good wavelength stability and no power variation, without temperature control.

An object of the present invention is to prevent mode hopping, to improve wavelength stability, and to reduce the variation in the optical power without using a Peltier device.

A grating device according to the present invention comprises:
a support substrate;
an optical material layer disposed on the support substrate and having a thickness of 0.5 µm or more and 3.0 µm or less;
a ridge optical waveguide formed by a pair of ridge grooves in the optical material layer and comprising a light-receiving surface for receiving a semiconductor laser light and a light-emitting surface for emitting a light having a desired wavelength;
a Bragg grating comprising convexes and concaves formed in the ridge optical waveguide; and
a propagating portion disposed between the light-receiving surface and the Bragg grating, wherein relationships represented by the following Formulas (1) to (4) are satisfied, $$0.8 \text{ nm} \leq \Delta\lambda_G \leq 6.0 \text{ nm} \quad (1)$$

$$10 \text{ µm} \leq L_b \leq 300 \text{ µm} \quad (2)$$

$$20 \text{ nm} \leq td \leq 250 \text{ nm} \quad (3)$$

$$n_b \geq 1.8 \quad (4)$$

wherein $\Delta\lambda_G$ in the Formula (1) is the full width at half maximum of a peak Bragg reflectance,
wherein $L_b$ in the Formula (2) is a length of the Bragg grating,
wherein td in the Formula (3) is a depth of said convexes and concaves constituting said Bragg grating, and
wherein $n_b$ in the Formula (4) is a refractive index of the material that constitutes the Bragg grating.

The present invention is characterized by an external resonator type light emitting system including a light source that emits a semiconductor laser light and a grating device constituting an external resonator with the light source, wherein the light source includes an active layer that emits the semiconductor laser light, and wherein the grating device is the grating device described above.

Generally, in the case of using a fiber grating, quartz has a low temperature coefficient of the refractive index, and thus, $d\lambda_G/dT$ is low, and $|d\lambda_G/dT - d\lambda_{Tm}dT|$ is high. Thus, the temperature range $\Delta T$ at which a mode hop occurs tends to be low.

Thus, the present invention uses a material that allows a waveguide substrate having a grating formed thereon to have a refractive index of 1.8 or more. This can increase the temperature coefficient of the refractive index and $d\lambda_G/dT$ and then can decrease $|d\lambda_G/dT - d\lambda_{Tm}dT|$, which can increase the temperature range $\Delta T$ at which a mode hop occurs.

Based on the foregoing, the present invention sets the full width at half maximum $\Delta\lambda_G$ of the peak Bragg reflectance at a large value, contrary to common knowledge in the art. Then, to prevent mode hopping, it is necessary to widen the wavelength spacing (longitudinal mode spacing) satisfying the phase condition. Thus, it is necessary to decrease the resonator length, and then the grating device has a short length Lb of 300 µm or less.

Then, $\Delta\lambda_G$ can be made 0.8 nm or more and 6 nm or less by adjusting the depth td of the grooves that constitute a Bragg grating within a range of 20 nm or more and 250 nm or less, and the number of the longitudinal modes within the $\Delta\lambda_G$ can be adjusted within a range of from 2 to 5. Thus, the wavelengths satisfying the phase condition are discrete. When the number of the longitudinal modes within $\Delta\lambda_G$ is 2 or more and 5 or less, mode hops repeatedly occur within $\Delta\lambda_G$, and any mode hops never occur outside of $\Delta\lambda_G$. Thus, any large mode hops never occur, from which the inventors have found that the wavelength stability can be improved and that the variation in the optical power can be reduced, thereby achieving the present invention.

BRIEF DESCRIPTION OF THE DRAWINGS

FIG. 9 illustrates results of reflectance and full width at one half the maximum of reflectance at a grating length of from 10 µm to 1000 µm in Example 1.

FIG. 10 illustrates results of reflectance and full width at half maximum at a grating length of 100 µm or more at a grating groove depth of 200 nm and 350 nm in Example 1.

DESCRIPTION OF THE EMBODIMENTS

Figure 1:
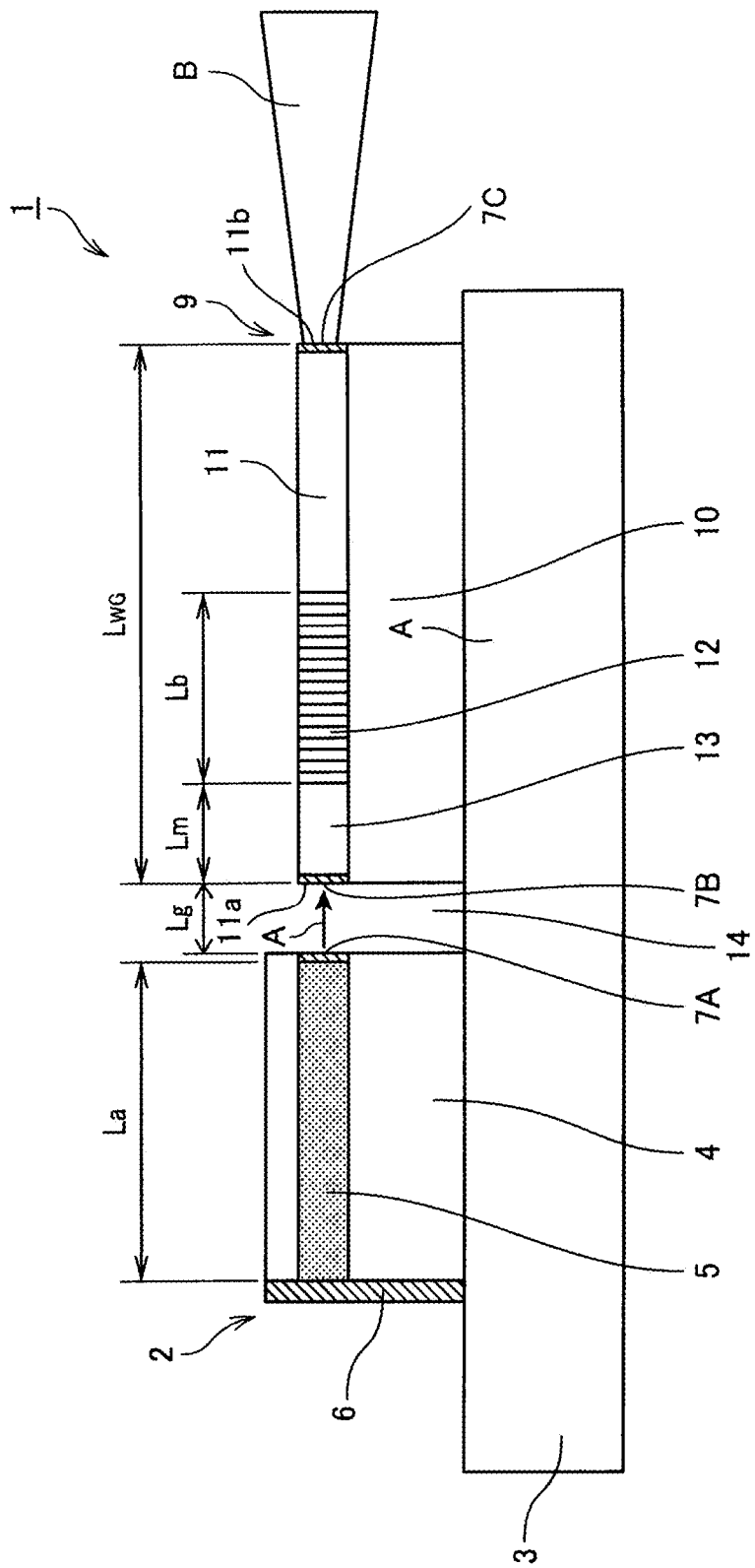
FIG. 1 is a schematic view of an external resonator type light emitting system.

An external resonator type light emitting system 1 schematically illustrated in FIG. 1 includes a light source 2 that emits semiconductor laser light and a grating device 9. The light source 2 and the grating device 9 are mounted on a common substrate 3.

The light source 2 includes an active layer 5 that emits semiconductor laser light. In the embodiment, the active layer 5 is disposed on a substrate 4. A reflective coating 6 is disposed on an outer end face of the substrate 4, and an anti-reflective layer 7A is disposed on the end face of the active layer 5, facing the grating device.

The light source 2 may oscillate laser by itself. As used herein, "oscillates laser by itself" means that the light source can oscillate laser without a grating device and an external resonator. In this case, the light source 2 preferably operates in a single longitudinal mode. However, in the case of an external-resonator type laser system that uses a grating device, the reflective characteristics can have wavelength dependence. Then, control of the wavelength dependence of the reflective characteristics allows the external resonator to operate in a single longitudinal mode, even if the light source 2 operates in a multi-longitudinal mode.

Figure 3:
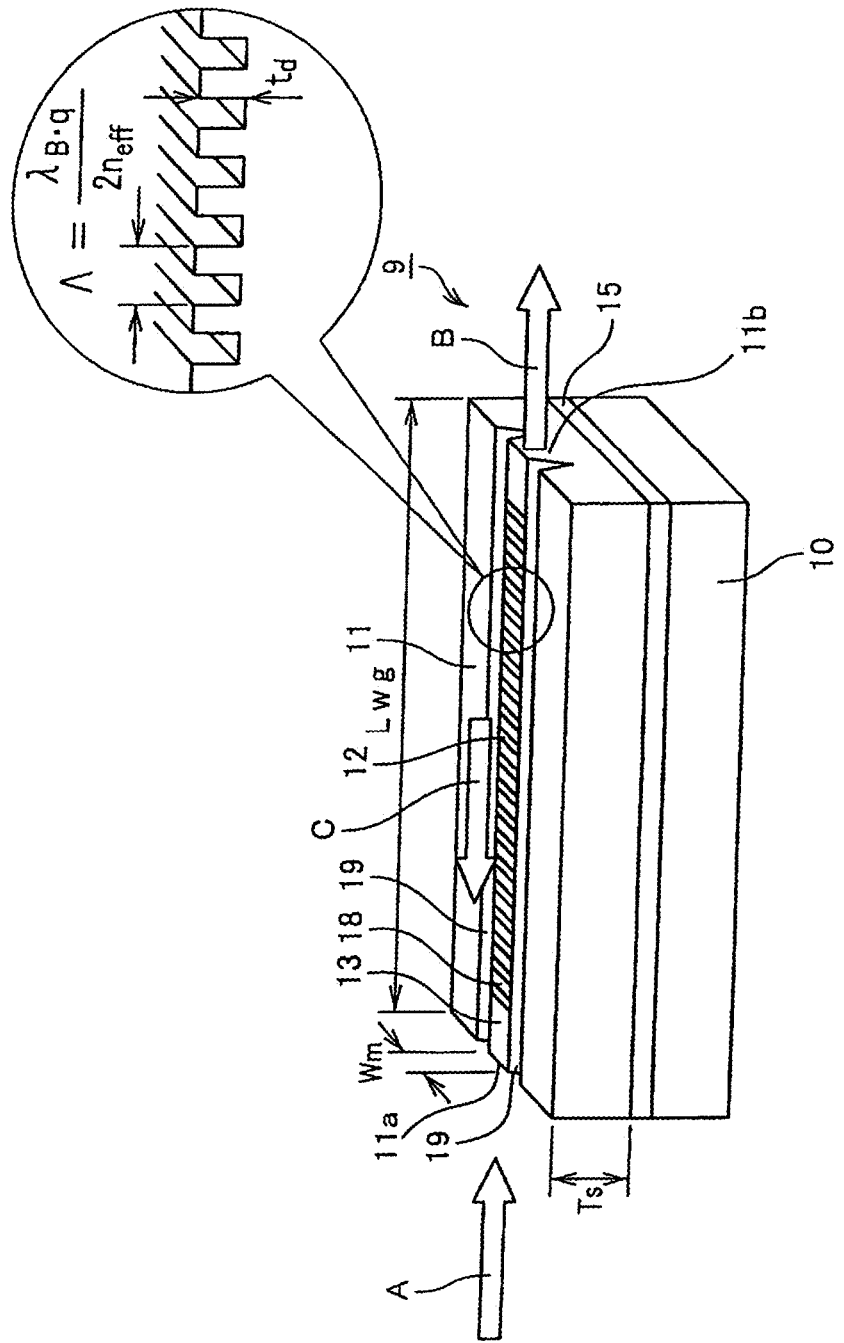
FIG. 3 is a perspective view schematically illustrating a grating device.

In this case, a high reflective coating 6 is disposed on the outer end face of the substrate 4, and a coating having a reflectance that is lower than the reflectance of the grating is disposed on an end face facing the grating device As illustrated in FIG. 1 and FIG. 3, the grating device 9 includes an optical material layer 11 that has a light-receiving surface 11a for receiving semiconductor laser light A and a light-emitting surface 11b for emitting light B having a desired wavelength. C is reflected light. A Bragg grating 12 is formed in the optical material layer 11. A propagating portion 13 having no grating formed therein is disposed between the light-receiving surface 11a and the Bragg grating 12 of the optical material layer 11. The propagating portion 13 is opposed to the active layer 5 via a gap 14. 7B is an anti-reflective coating disposed on the light-receiving side of the optical material layer 11, and 7C is an anti-reflective coating disposed on the light-emitting side of the optical material layer 11. An optical material layer 18 is a ridge optical waveguide and is disposed in the optical material layer 11. The optical material layer 11 may be formed on the same surface as the Bragg grating 12, or may be formed on the opposing surface.

The anti-reflective layers 7A, 7B, and 7C need only to have a reflectance that is smaller than the reflectance of the grating and more preferably have a reflectance of 0.1% or less. However, when the end faces have a reflectance that is smaller than the reflectance of the grating, the anti-reflective layers may not be disposed, and a reflective coating may be provided.

Figure 2:
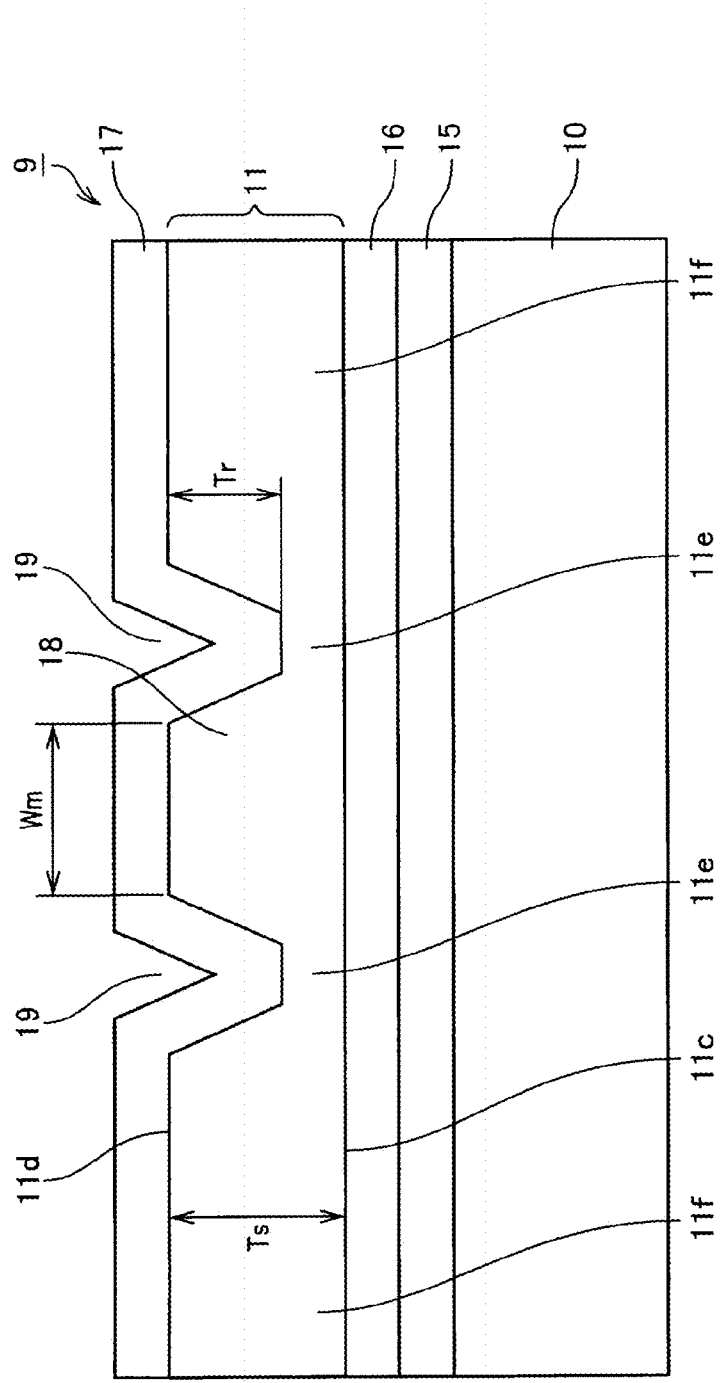
FIG. 2 is a cross-sectional view of a grating device.

In the embodiment, an adhesive layer 15 is disposed on the substrate 10 as illustrated in FIG. 2. On the adhesive layer 15, the optical material layer 11 is formed via a lower buffer layer 16. On the optical material layer 11, an upper buffer layer 17 is formed. The optical material layer 11 has, for example, a pair of ridge grooves 19 formed therein. The ridge optical waveguide 18 is formed between the ridge grooves.

The ridge grooves 19 are configured not to completely reach the bottom of the optical material layer 11. Thus, a thin portion 11e is formed under the respective ridge grooves 19, and an extension portion 11f is formed on the exterior of the respective thin portions 11e. In the present invention, the ridge grooves 19 do not completely reach the bottom of the optical material layer 11, and the thin portions 11e are present between the bottom of the ridge grooves 19 and the buffer layer.

In this case, the Bragg grating may be formed on a flat surface 11c or a surface 11d. To reduce the variation in the shape of the Bragg grating and the ridge grooves, the Bragg grating and the ridge grooves 19 are preferably disposed on the opposite side from the substrate by forming the Bragg grating on the surface 11c.

Such ridge optical waveguide can provide weaker optical confinement compared with a configuration with ridge grooves completely reaching the bottom of the optical material layer (a configuration without any thin portion 11e and with extension portions 11d formed). Thus, even if the spot shape of the light is large, the laser can operate with the transverse mode being fundamental mode without operation in a multi mode laser.

Conventional grating devices include, as an optical waveguide, a core layer that completely reaches the bottom of the optical material layer. The optical waveguide disclosed in the Patent Document 8 forms a core layer that completely reaches the bottom. When the elements include a $SiO_xN_{1-x}$ core layer and a $SiO_2$ cladding layer, the core has a width of 1.2 μm and a thickness of 0.4 μm.

When the elements include a Si/SiN core layer having a higher refractive index and a $SiO_2$ cladding layer, the core has a width of 0.28 μm and a thickness of 0.255 μm and thus has a smaller size. In this case, the optical waveguide provides strong optical confinement, and thus the core has such small size so as to propagate light only with the transverse mode being fundamental mode.

Patent Document 9 discloses a diffused waveguide and a proton exchange waveguide. In these optical waveguide, the spot shape depends on diffusion distribution of doped Ti or proton. Thus, the refractive index difference between the core and the cladding cannot be increased, and the optical confinement is further decreased, compared with ridge optical waveguides. Thus, the spot shape cannot have a large aspect ratio, which is the ratio of the horizontal dimension to the longitudinal dimension, and it is also difficult to control the shape.

Attempts to increase the optical confinement cause the problems such as increased propagation loss due to heavy doping and degradation due to optical damage.

When a grating device is used in an external resonator type laser, the output light needs to have a Gaussian-shaped optical spot, and light in transverse mode is desirably propagated in fundamental mode. Thus, an optical waveguide of the grating device is preferably a fundamental mode waveguide so that multi-modes are not excited by laser light.

Figure 16:
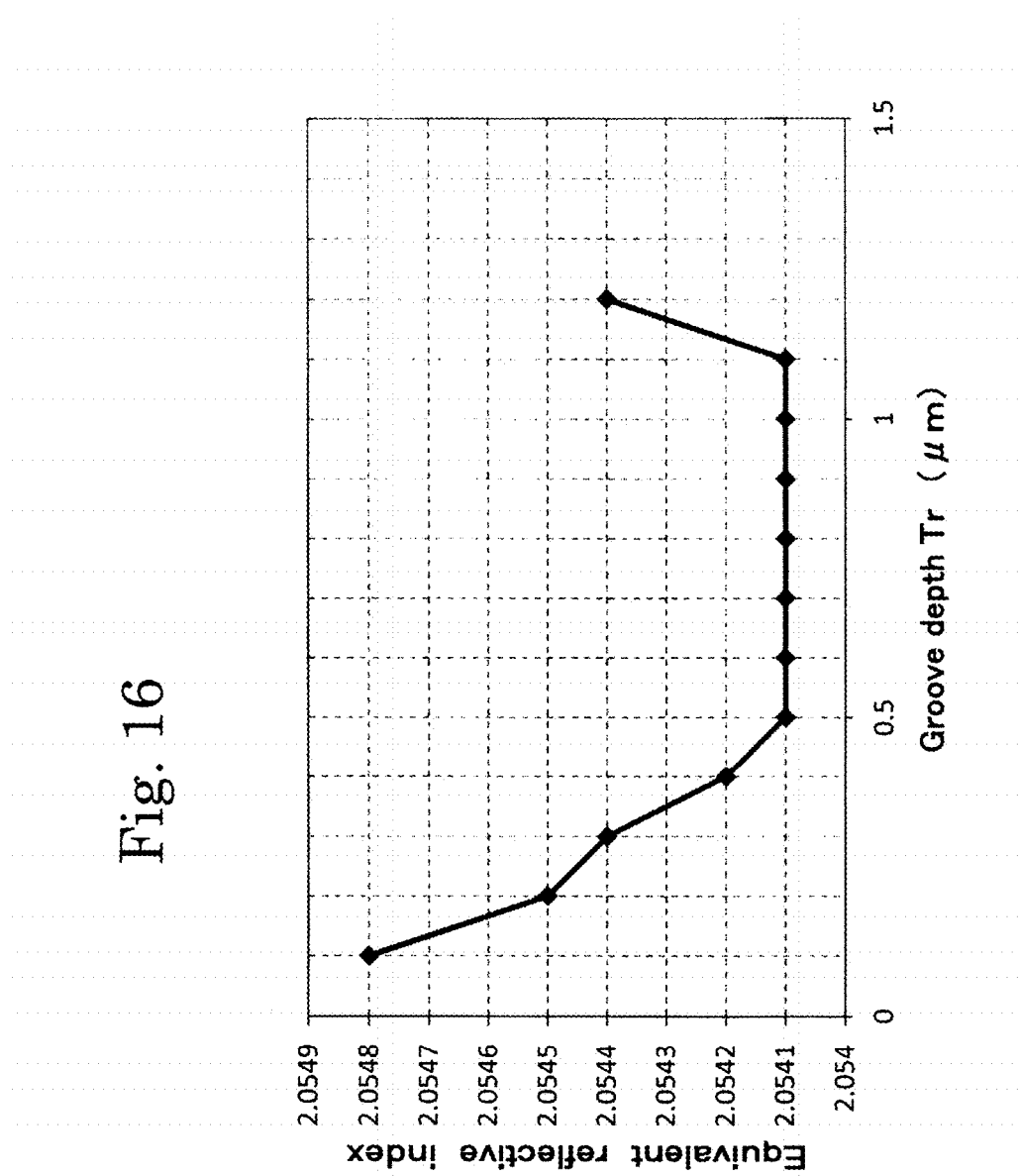
FIG. 16 illustrates the results of calculations of effective refractive index (equivalent refractive index) of the fundamental transverse mode of an optical waveguide when ridge grooves have a depth $T_r$ of from 0.1 µm to 1.2 µm.

FIG. 16 illustrates the results of calculations of effective refractive indices (equivalent refractive indices) at a wavelength of 800 nm of the fundamental and transverse mode of the optical waveguides having a $Ta_2O_5$ optical material layer, a refractive index of 2.08, a thickness $T_s$ of 1.2 μm, a ridge width Wm of 3 μm, and a groove depth $T_r$ of from 0.1 μm to 1.2 μm.

The results indicate that when $T_r$ is in the range of from 0.1 to 0.4 μm, the light leaks to the substrate and thus is propagated in a substrate mode. When Tr is in the range of from 0.5 to 1.1 μm, the effective refractive indices do not change, and the light is propagated in a ridge waveguide mode. However, the results indicate that when Tr is 1.2 μm, and the groove reaches the bottom, then the effective refractive index increases, and the confinement is stronger.

Figure 17:
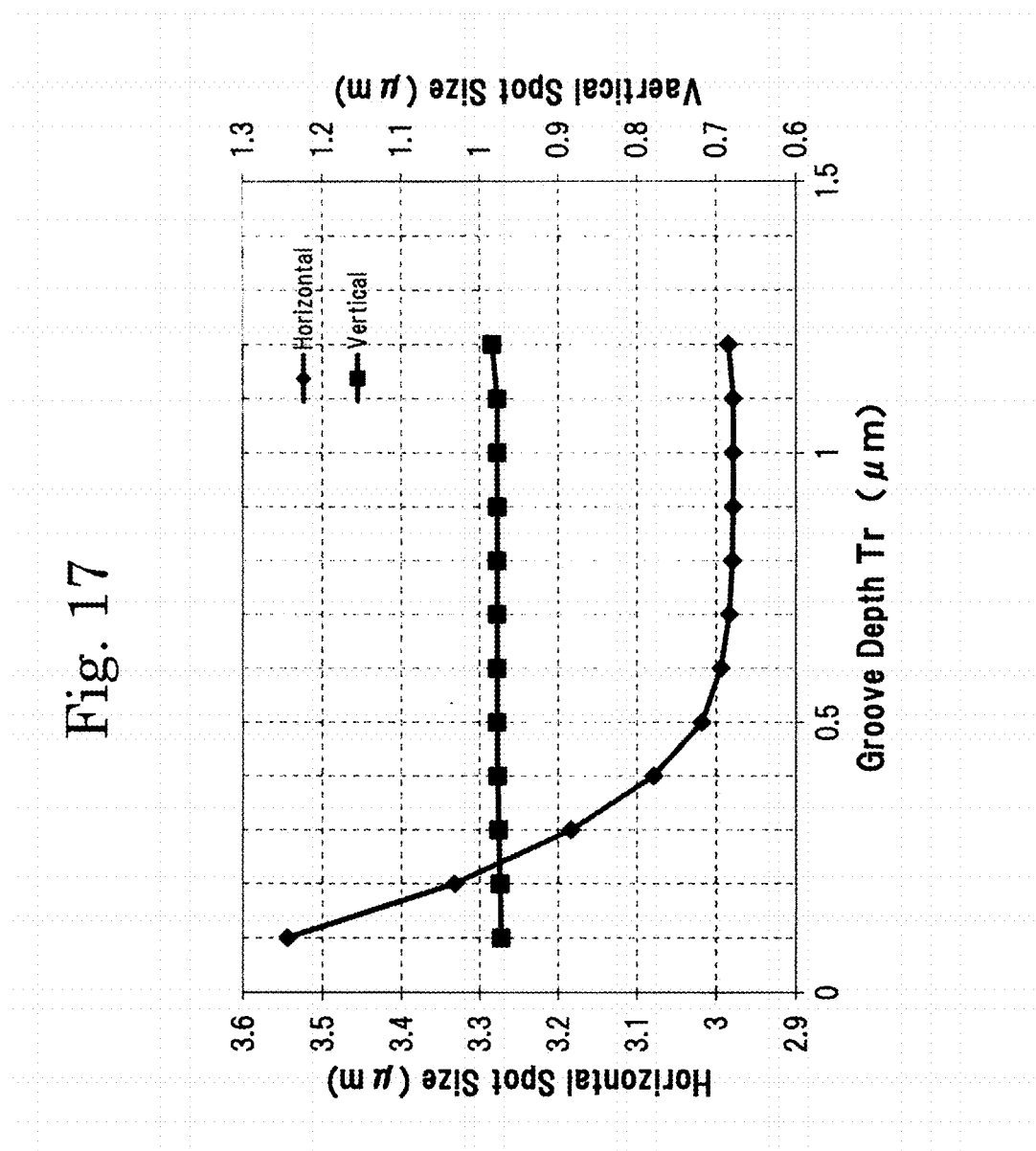
FIG. 17 illustrates the results of calculations of horizontal and longitudinal spot sizes in the fundamental mode of an optical waveguide used for the calculation in FIG. 16.

FIG. 17 illustrates the results of calculations of horizontal and longitudinal spot sizes of the fundamental mode of the optical waveguides used for the calculation in FIG. 16. The results indicate that a larger $T_r$ leads to a smaller horizontal spot size and a stronger confinement. When $T_r$ is in the range of from 0.5 μm to 1.2 μm, where the grooves reaches the bottom, the horizontal spot shapes are nearly unchanged. The results also indicate that the longitudinal spot sizes are not dependent on $T_r$ and substantially constant.

In the case of external resonator type lasers, the grating device preferably has an optical spot shape that is larger than the optical spot shape of the laser light, and the optical material layer preferably has a thickness Ts of 0.5 μm or more, so that laser light efficiently excites the fundamental mode of the grating device. If the thickness Ts were large, it would be difficult to reduce the affect of the multi-mode. In view of this, the optical material layer preferably has a thickness Ts of 3 μm or less and more preferably 2.5 μm or less.

It has been confirmed that in view of the above, the groove depth $T_r$ can be standardized by the thickness $T_s$ of the optical material layer, even when the material of the optical material layer is changed. In particular, $T_r/T_s$ is preferably 0.4 or more and preferably 0.9 or less.

When a grating device is used in an external resonator type laser, transverse mode of the grating device is of fundamental mode device, as described above. However, the optical material layer preferably has a thickness of 0.5 μm or more to allow laser light to be highly efficiently coupled into the waveguide, and such waveguide is likely to become multi-mode.

When the transverse mode of light that exits the optical waveguide is multi-mode, a plurality of reflection wavelengths of the grating are present in association with the respective effective refractive indices of respective waveguide modes. Thus, multi-mode laser oscillation is caused. However, increase of the effective refractive index difference between the fundamental mode and the higher order mode to shift the reflection wavelength of the higher order mode to the outside of the laser gain range can provide fundamental mode light without causing higher order mode laser oscillation. In view of this, the reflection wavelength difference between the fundamental mode and the higher order mode is preferably 2.5 nm or more and more preferably 3 nm or more.

When a semiconductor laser is used as the light source 2, the laser gain range is narrow, and the laser oscillation wavelength range is narrow. Thus, fundamental mode light can be more readily produced.

In an optical waveguide having a pair of ridge grooves formed therein, a grating device can provide weaker confinement, and thus it is less likely to produce multi and transverse mode light. If multi-mode light is produced, the difference from the fundamental mode can be large, and excitation of the multi-modes can be suppressed. In view of this, the lower limit of $T_r/T_s$ is preferably 0.4 or more and more preferably 0.55. The upper limit is preferably 0.9 or less and more preferably 0.75 or less.

Figure 4:
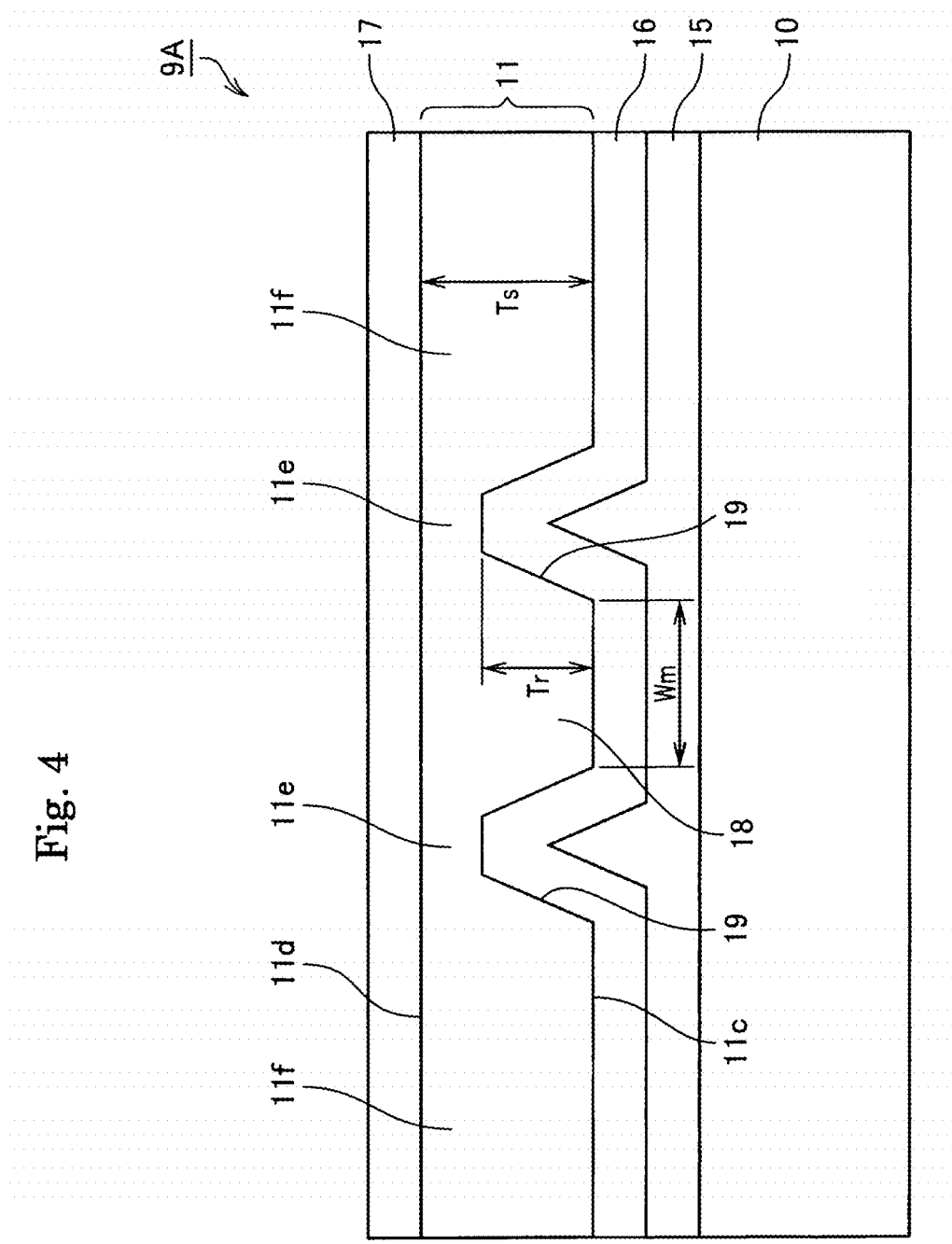
FIG. 4 is a cross-sectional view of another grating device.

In an element 9A illustrated in FIG. 4, an adhesive layer 15 is disposed on the substrate 10. On the adhesive layer 15, the optical material layer 11 is formed via a lower buffer layer 16. On the optical material layer 11, an upper buffer layer 17 is formed. On a surface of the optical material layer 11, facing the substrate 10, a pair of ridge grooves 19, for example, are formed. A ridge optical waveguide 18 is formed between the ridge grooves 19. In this case, a Bragg grating may be formed on the side of a flat surface 11d or on a surface 11c having the ridge grooves. To reduce the variation in the shape of the Bragg grating and the ridge grooves, the Bragg grating and the ridge grooves 19 are preferably disposed on the opposite side from the substrate by forming the Bragg grating on the side of the flat surface 11d. The upper buffer layer 17 optionally do not exist. In this case, an air layer can be in direct contact with the grating. Thus, provision or omission of grating grooves can increase the refractive index difference, and a shorter grating length can lead to a higher reflectance.

Figure 5:
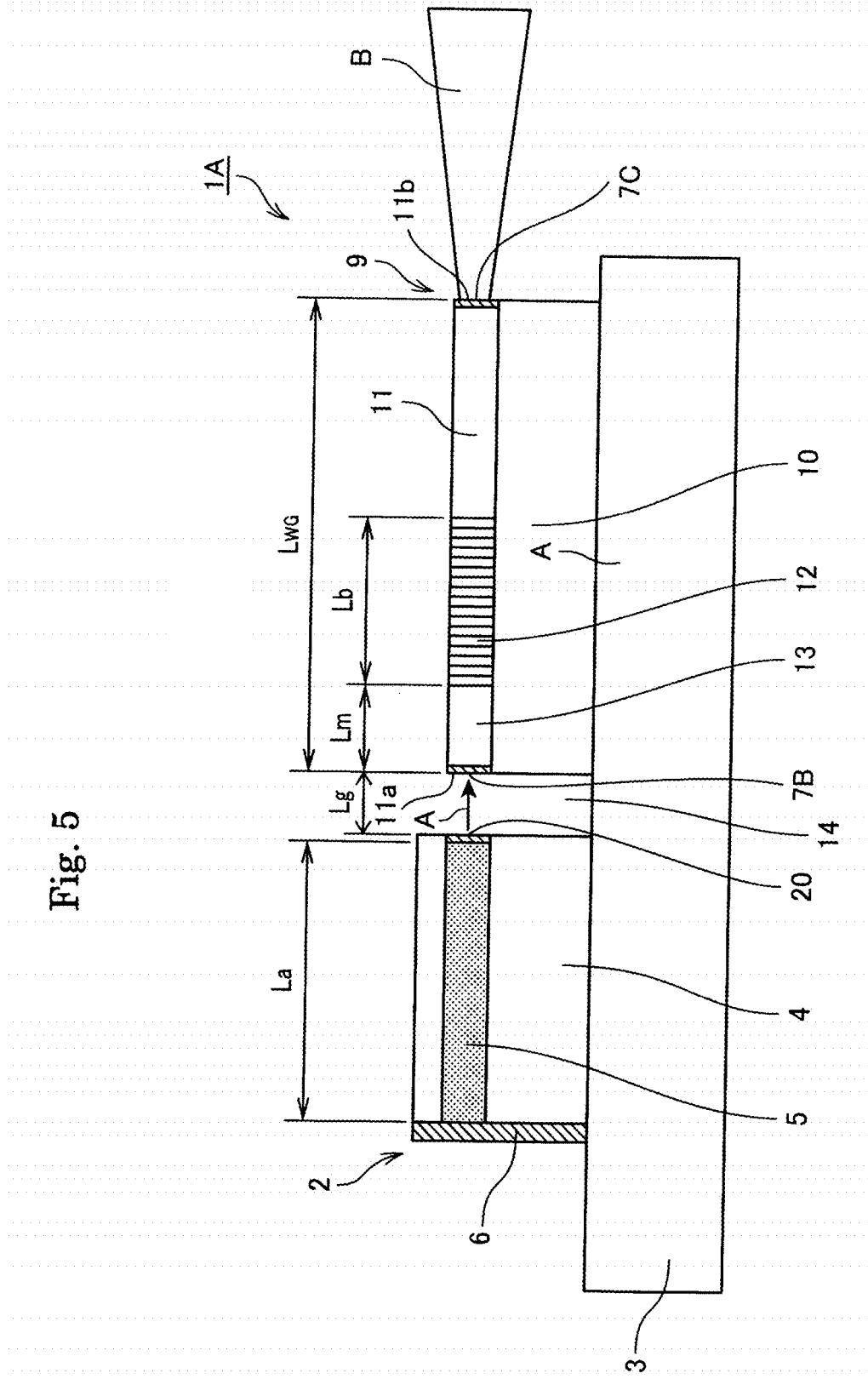
FIG. 5 is a schematic view of an external resonator type light emitting system according to another embodiment.

FIG. 5 illustrates a device 1A according to another embodiment. The majority of the device 1A is similar to the device 1 in FIG. 1. A light source 2 includes an active layer 5 that emits laser light, while an anti-reflective layer 7A is not disposed on an end face of the active layer 5, facing a grating device 9, and a reflective coating 20 is formed as an alternative.

In this case, the laser oscillation wavelength of the laser depends on the wavelength of the light reflected by the grating. The laser oscillation condition is satisfied if the light reflected by the grating and the light reflected by the end face of the active layer 5, facing the grating device, have a gain higher than the laser gain threshold. This can provide laser light having high wavelength stability.

The wavelength stability can be further improved by increasing the amount of light reflected by the grating. In view of this, the reflectance of the grating is preferably higher than the reflectance of the end face of the active layer 5.

As the light source, highly reliable GaAs-based or InP-based laser is suitable. When, for example, a nonlinear optical element is used to emit green laser by second harmonic generation in an application of the present structure, GaAs-based laser, which emits light having a wavelength of about 1064 nm, is used. GaAs-based laser and InP-base laser are highly reliable, and thus a light source arranged in a one-dimensional array such as a laser array is also contemplable. The light source may be a superluminescent diode or a semiconductor optical amplifier (SOA).

A longer wavelength leads to a larger variation of Bragg wavelength with temperature, and thus the light source 2 particularly preferably emits light having a center wavelength of 990 nm or less to improve the wavelength stability. In contrast, an excessively short wavelength leads to an excessively large refractive index change $\Delta na$ of the semiconductor material, thus the light source 2 particularly preferably emits light having a center wavelength of 780 nm or more to improve the wavelength stability.

The material and the wavelength of the active layer can be selected as desired.

A method for stabilizing power by combination of a semiconductor laser and a grating device is disclosed in the following literature:

(Non-Patent Document 3: Furukawa Review, January, 2000, vols. 105, p 24-29)

The ridge optical waveguide can be obtained by physical machining by, for example, cutting with a peripheral blade or laser ablation and shape-forming.

A Bragg grating can be formed by the following physical or chemical etching.

In particular, a layer of metal such as Ni or Ti is deposited on a high refractive index substrate, and windows are regularly formed by photolithography to form an etch mask. Then, regular grating grooves are formed using a device for dry etching such as reactive ion etching. Finally, the metal mask can be removed to form the Bragg grating.

To further improve the optical damage resistance of the optical waveguide, one or more metal elements selected from the group consisting of magnesium (Mg), zinc (Zn), scandium (Sc), and indium (In) may be included in the high refractive index layer. In this case, magnesium is particularly preferred. As a doping material, a rare earth element can be included in the crystal. The rare earth element is particularly preferably Nd, Er, Tm, Ho, Dy, or Pr.

The material for the adhesive layer may be an inorganic adhesive, an organic adhesive, or a combination of the inorganic adhesive and the organic adhesive.

The optical material layer 11 may be formed by deposition on the support substrate by a thin film deposition process. Examples of the thin film deposition process can include sputtering, vapor deposition, and CVD. In this case, the optical material layer 11 is directly formed on the support substrate, and the adhesive layer described above does not exist.

The specific material of the support substrate is not restricted, and the example can include lithium niobate, lithium tantalate, glass such as silica glass and quartz, Si, sapphire, aluminum nitride, and SiC.

The reflectance of the anti-reflective layer needs to be equal to or lower than the reflectance of the grating, and the laminate deposited to form the anti-reflective layer may be a laminate film of oxide such as silicon dioxide and tantalum pentoxide or a metal film.

Each of the end faces of the light source element and the grating device may be beveled to reduce reflection on the end faces. The grating device and the support substrate are adhesively bonded together in the example in FIG. 2 and may be directly bonded together.

Now, the conditions of the present invention will be further described with reference to the configuration as illustrate in FIG. 15.

Mathematical formulas are abstract and are difficult to understand, and thus first, an embodiment of the present invention is simply compared with a typical mode of the conventional art to describe the characteristics of the present invention. Then, various conditions of the present invention will be described.

First, the laser oscillation condition of a semiconductor laser is determined by the gain condition and the phase condition as represented by the following formula:

$$(C_{out}^2)^4 |r_1||r_2| \exp\{(\zeta_t g_{th} - \alpha_a) L_a - \alpha_b L_b\} \times \exp\{j(-\varphi_1 - \varphi_2 - 2\beta L_a)\} = 1 \quad (2\text{-}1)$$

The gain condition is represented by the following formula derived from the Formula (2-1):

$$\zeta_t g_{th} = \alpha_a L_a + \alpha_b L_b + \frac{1}{L_a} \ln\left(\frac{1}{|r_1||r_2|C_{out}^2}\right) \quad \text{Formula (2-2)}$$

In the formulas, $\alpha a$, $\alpha g$, $\alpha wg$, $\alpha gr$ are the loss coefficient in the active layer, the gap between the semiconductor laser and the waveguide, the waveguide portion on the input side without any grating, and the grating portion, respectively. La, Lg, Lwg, and Lgr are the length of the active layer, the gap between the semiconductor laser and the waveguide, the waveguide portion on the input side without any grating, and the grating portion, respectively. r1 and r2 are mirror reflectances (r2 is the reflectance of the grating). Cout is a coupling loss between the grating device and the light source. $\xi_t g_t$ is the gain threshold of the laser oscillation medium. φ1 is a phase change on a reflective mirror on the laser side, and φ2 is a phase change on the grating portion.

The Formula (2-2) indicates that when the gain $\xi_t g_{th}$ (gain threshold) of the laser oscillation medium is larger than the loss, the laser oscillates laser light. The gain curve (wavelength dependence) of the laser oscillation medium has a full width at half maximum of 50 nm or more, which is broad. Most of the loss terms (on the right side) are nearly independent on wavelength except for the reflectance of the grating, and thus the gain condition depends on the grating. Thus, for comparison, the gain condition can be considered from only the grating.

The phase condition is represented by the following formula derived from the Formula (2-1). It is noted that φ1 is 0.

$$\varphi_2 + 2\beta L_a = 2p\pi \text{ (} p \text{ represents an integer)} \quad \text{Formula (2-3)}$$

When the light source 2 oscillates laser light, the source is a composite resonator. Thus, the above Formulas (2-1), (2-2), and (2-3) become complex and can be considered as indications of laser oscillation.

Figure 6:
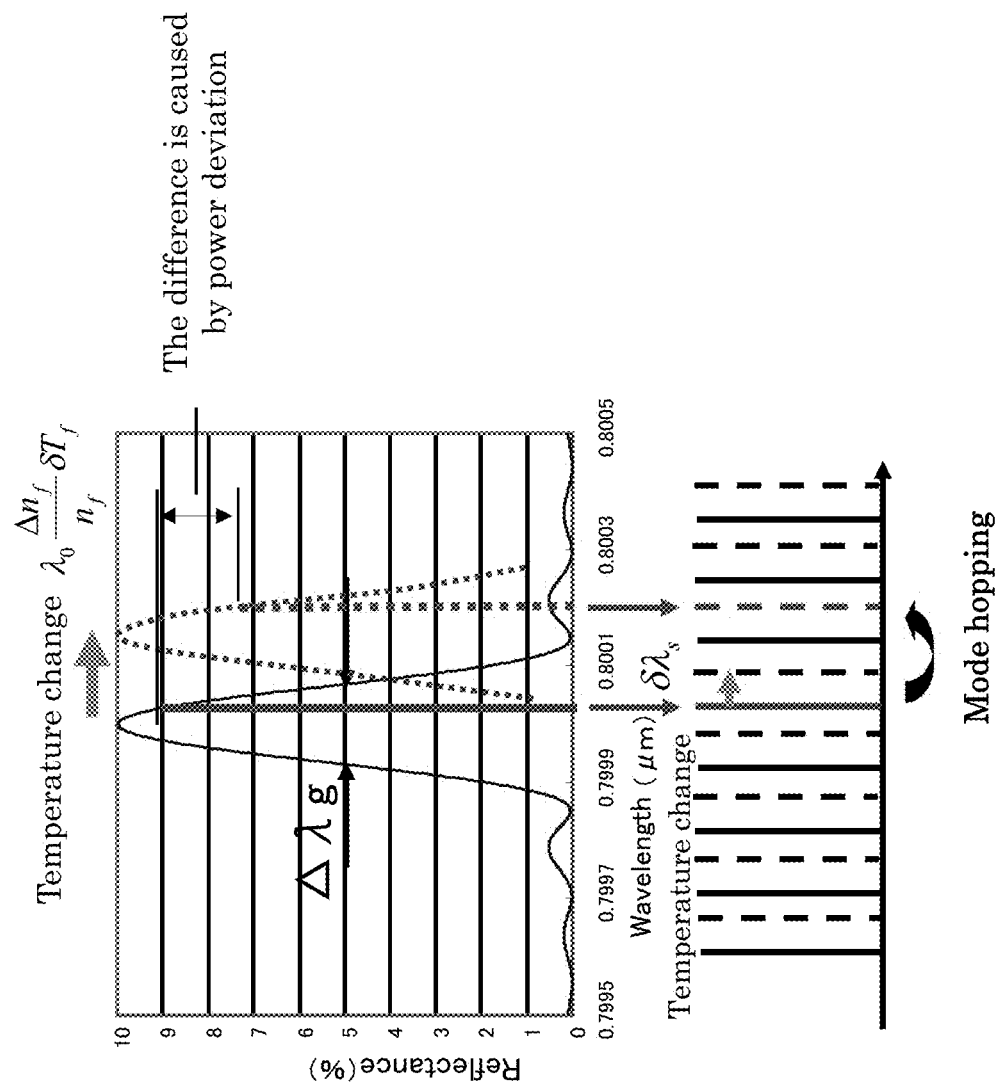
FIG. 6 illustrates a mode hop according to a conventional example.
Figure 7:
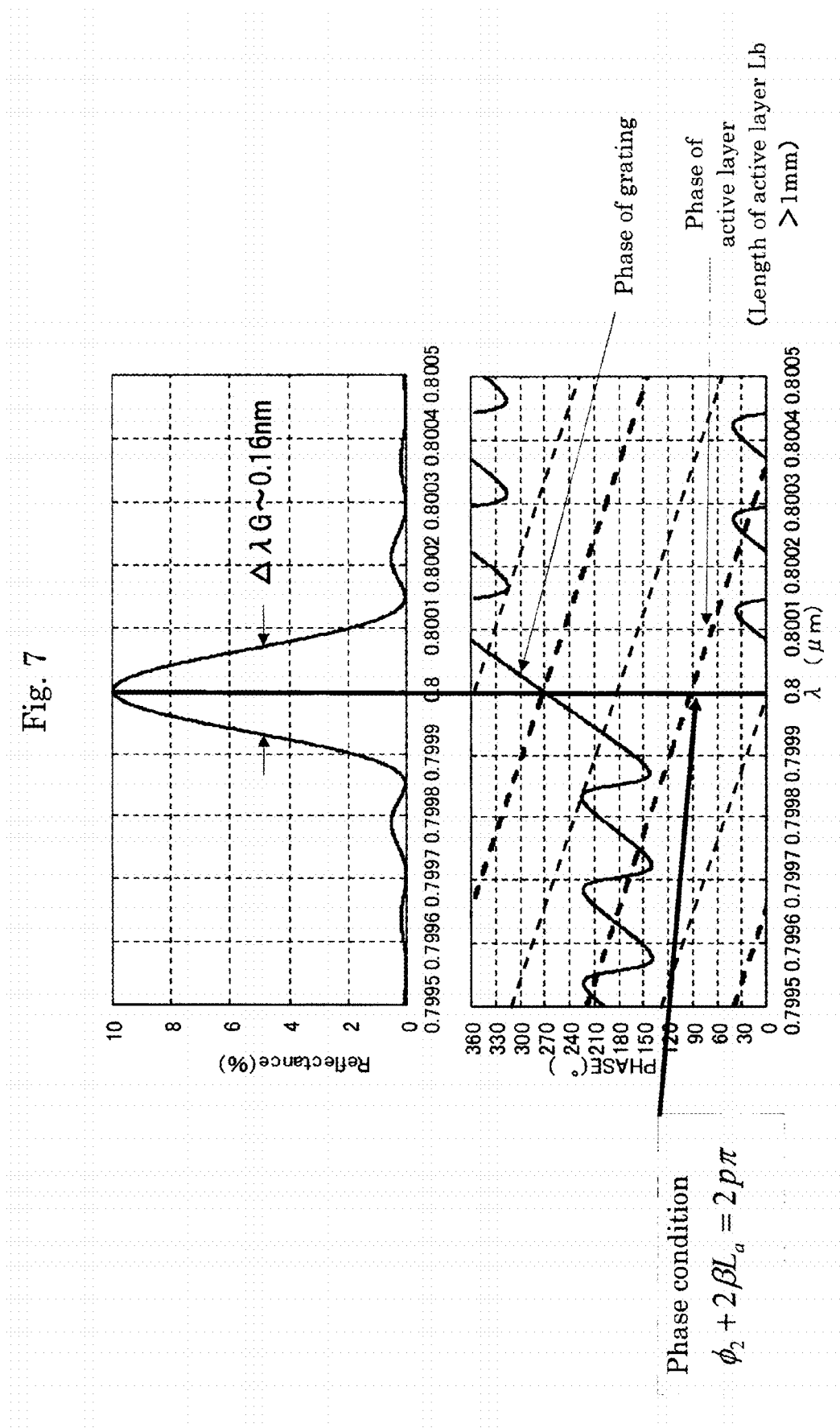
FIG. 7 illustrates a mode hop according to a conventional example.

External-resonator type lasers that use a quartz glass optical waveguide or FBG as an external resonator have been commercialized. In a prior design concept, as illustrated in FIG. 6 and FIG. 7, the reflective characteristics of the grating are $\Delta\lambda_G$ of about 0.2 nm and a reflectance of 10%. Thus, the grating portion has a length of 1 mm. With regard to the phase condition, the wavelengths satisfying the condition are discrete, and the device is designed so that the Formula (2-3) is satisfied at two or three points within $\Delta\lambda_G$. Thus, the active layer of the laser oscillation medium needs to have a long length, and the active layer having a length of 1 mm or more is used.

In the case of a glass waveguide or FBG, λg has a very low dependence on temperature, and $d\lambda_G/dT$ is about 0.01 nm/° C. As a result, the external resonator type laser has a characteristic of high wavelength stability.

In contrast, however, the wavelengths satisfying the phase condition have a high dependence on temperature, and $d\lambda_S/dT$ and $d\lambda_{TM}/dT$ are both equal to 0.05 nm/° C. Thus, the difference is 0.04 nm/° C.

When $SiO_2$ or $SiO(1-x)N_x$ is used for the core layer, the change Δnf of the refractive index with temperature is as small as $1\times10^{-5}/°$ C. At a wavelength of 1.3 μm, λg has a very low dependency on temperature, and $d\lambda_G/dT$ is 0.01 nm/° C. With regard to the temperature coefficient of the wavelengths (laser oscillation wavelengths) satisfying the phase condition of the external resonator, when InGaAsP-based laser is used, the equivalent refractive index of the light source is 3.6, the change of the refractive index with temperature is $3\times10^{-4}/°$ C., the length La is 400 μm, the equivalent refractive index of the grating is 1.54, $1\times10^{-5}/°$ C., and the length of the grating is 155 μm, $d\lambda_G/dT$ and $d\lambda_{TM}/dT$ are both equal to 0.09 nm/° C. Thus, the difference is 0.08 nm/° C.

The spectrum of the laser light oscillated in this manner has a linewidth of 0.2 nm or less. To oscillate laser over a broad temperature range, the laser oscillation wavelength of the external resonator at a room temperature of 25° C. is preferably shorter than the center wavelength of the reflectance of the grating in order to further broaden the temperature range in which a mode hop does not occur. In this case, as the temperature rises, the laser oscillation wavelength is shifted to a longer wavelength, and the resonator produces laser light at a wavelength that is longer than the center wavelength of the reflectance of the grating.

To oscillate laser over a broad temperature range, the laser oscillation wavelength of the external resonator at a room temperature of 25° C. is preferably longer than the laser oscillation wavelength of the light source 2 at the same temperature in order to further broaden the temperature range in which a mode hop does not occur. In this case, as the temperature rises, the external resonator produces laser light at a wavelength that is shorter than the laser oscillation wavelength of the light source 2.

The difference between the laser oscillation wavelength of the external resonator and the laser oscillation wavelength of the light source 2 at room temperature is preferably 0.5 nm or more and may also be 2 nm or more in order to increase the temperature tolerance of the laser oscillation. However, if the wavelength difference were too large, the change of power with temperature would be increased. In this view, the difference is preferably 10 nm or less and more preferably 6 nm or less.

Generally, the temperature $T_{mh}$ at which a mode hop occurs can be represented by the following formula according to Non-Patent Document 1 (Ta is assumed to be equal to Tf.).

$\Delta G_{TM}$ is the wavelength spacing (longitudinal mode spacing) satisfying the phase condition of the external resonator type laser. The Δλ used above is equal to $\Delta G_{TM}$, and λs is equal to $\lambda_{TM}$.

$$T_{mh} = \frac{\Delta G_{TM}}{\left|\frac{d\lambda_G}{dT} - \frac{d\lambda_{TM}}{dT}\right|} \quad \text{Formula (2-4)}$$

Thus, in the conventional case, $T_{mh}$ is about 5° C., at which a mode hop is likely to occur. Thus, when a mode hop occurs, the power is changed by about 5% or more based on the reflective characteristics of the grating.

Because of this, external resonator type lasers that use a conventional glass waveguide or FBG use a Peltier element in operation to control the temperature.

In contrast, the present invention presupposes use of a grating device that decreases the denominator of the Formula (2-4). The denominator of the Formula (2-4) is preferably 0.03 nm/° C. or less. Preferred specific examples of the material of the optical material layer include gallium arsenide (GaAs), lithium niobate (LN), tantalum oxide ($Ta_2O_5$), zinc oxide (ZnO), and aluminum oxide ($Al_2O_3$).

As long as five or less wavelengths that satisfy the phase condition are present within $\Delta\lambda_G$, external resonator type lasers can operate in a stable laser oscillation condition even when a mode hop occurs.

In particular, when, for example, polarized light along the Z-axis of LN is used, the structure of the present invention exhibits a laser oscillation wavelength that changes at 0.1 nm/° C. as the temperature changes, depending on the temperature characteristics of the grating, but the power can be less likely to change even when a mode hop occurs. The structure of the present application has a grating length Lb of, for example, 100 μm in order to increase $\Delta\lambda_G$ and has a length La of, for example, 250 μm in order to increase $\Delta G_{TM}$.

The difference from Patent Document 6 will be also described.

The present application presupposes that the temperature coefficient of the grating wavelength is adjusted close to the temperature coefficient of the gain curve of the semiconductor material. Thus, a material having a refractive index of 1.8 or more is used. Additionally, the grating has a groove depth td of 20 nm or more and 250 nm or less, a reflectance of 3% or more and 60% or less, and a full width at half maximum $\Delta\lambda_G$ of 0.8 nm or more and 250 nm or less. These can provide a compact resonator structure and eliminate additional components, which can achieve temperature independence. In the Patent Document 6, the respective parameters are described as follows, any of which are within the scope of the conventional art.

$\Delta\lambda_G$=0.4 nm
Vertical mode spacing $\Delta G_{TM}$=0.2 nm
Grating length Lb=3 mm
Length of LD active layer La=600 μm
Length of propagating portion=1.5 mm Now, the following various conditions of the present invention will be described more specifically.

$$0.8 \text{ nm} \leq \Delta\lambda_G \leq 6.0 \text{ nm} \quad (1)$$

$$10 \text{ μm} \leq L_b \leq 300 \text{ μm} \quad (2)$$

$$20 \text{ nm} \leq td \leq 250 \text{ nm} \quad (3)$$

$$n_b \geq 1.8 \quad (4)$$

In the Formula (4), the material that constitutes the Bragg grating has a refractive index $n_b$ of 1.8 or more.

Although conventionally, a material, such as silica, having a lower refractive index is generally used, a material having a high refractive index constitutes the Bragg grating in the concept of the present invention. The reason is that a material having a high refractive index exhibits a large change in refractive index with temperature and can increase $T_{mh}$ in the Formula (2-4) and the temperature coefficient $d\lambda_G/dT$ of the grating as described above. In view of this, $n_b$ is more preferably 1.9 or more. Although the upper limit of $n_b$ is not critical, the upper limit is 4 or less and more preferably 3.6 or less, otherwise the grating would have a very small pitch, which makes it difficult to form the grating. For the same reason, the optical waveguide preferably has an equivalent refractive index of 3.3 or less.

The full width at half maximum $\Delta\lambda_G$ of the peak Bragg reflectance is 0.8 nm or more (Formula 1). $\lambda_G$ is a Bragg wavelength. In particular, as illustrated in FIG. 6 and FIG. 7, when the reflection wavelength of the Bragg grating is taken along the abscissa, and the reflectance is taken along the ordinate, then the Bragg wavelength refers to a wavelength at which the maximum reflectance is obtained. The full width at half maximum $\Delta\lambda_G$ refers to the distance between two wavelengths at which the reflectance is one-half of the peak reflectance at the Bragg wavelength.

The full width at half maximum $\Delta\lambda_G$ of the peak Bragg reflectance is 0.8 nm or more (Formula (1)). The purpose is to broaden the peak reflectance. In view of this, the full width at half maximum $\Delta\lambda_G$ is preferably 1.2 nm or more and more preferably 1.5 nm or more. The full width at half maximum $\Delta\lambda_G$ is 5 nm or less, more preferably 3 nm or less, and still more preferably 2 nm or less.

The Bragg grating has a length $L_b$ of 300 μm or less (Formula 2). The length $L_b$ of the Bragg grating refers to the length of the grating along the optical axis of the light propagated through the optical waveguide. The design concept of the present invention presupposes that the Bragg grating has a length $L_b$ of 300 μm or less, which is shorter than before. Thus, to make the laser less susceptible to mode hops, it is necessary to widen the wavelength spacing (longitudinal mode spacing) satisfying the phase condition. To achieve this, it is necessary to decrease the length of the resonator, and thus the length of the grating device is decreased. In view of this, the Bragg grating more preferably has a length $L_b$ of 200 μm or less.

Decrease of the length of the grating device results in decreased loss, which can reduce the laser oscillation threshold. This allows for operation at low current, with low heat generation, and with low energy.

The grating preferably has a length $L_b$ of 5 μm or more to achieve a reflectance of 3% or more and more preferably has a length $L_b$ of 10 μm or more to achieve a reflectance of 5% or more.

In the Formula (3), td refers to the depth of the convexes and concaves that constitute the Bragg grating. Satisfaction of 20 nm≤td≤250 nm can achieve $\Delta\lambda_G$ of 0.8 nm or more and 250 nm or less, and the number of the longitudinal modes within $\Delta\lambda_G$ can be adjusted to 2 or more and 5 or less. In view of this, td is more preferably 30 nm or more and still more preferably 200 nm or less. To achieve a full width at half maximum of 3 nm or less, td is preferably 150 nm or less.

In a suitable embodiment, the reflectance of the grating device is preferably set at 3% or more and 40% or less to promote laser oscillation. The reflectance is more preferably 5% or more to further stabilize the output power and is more preferably 25% or less to increase the output power.

Figure 15:
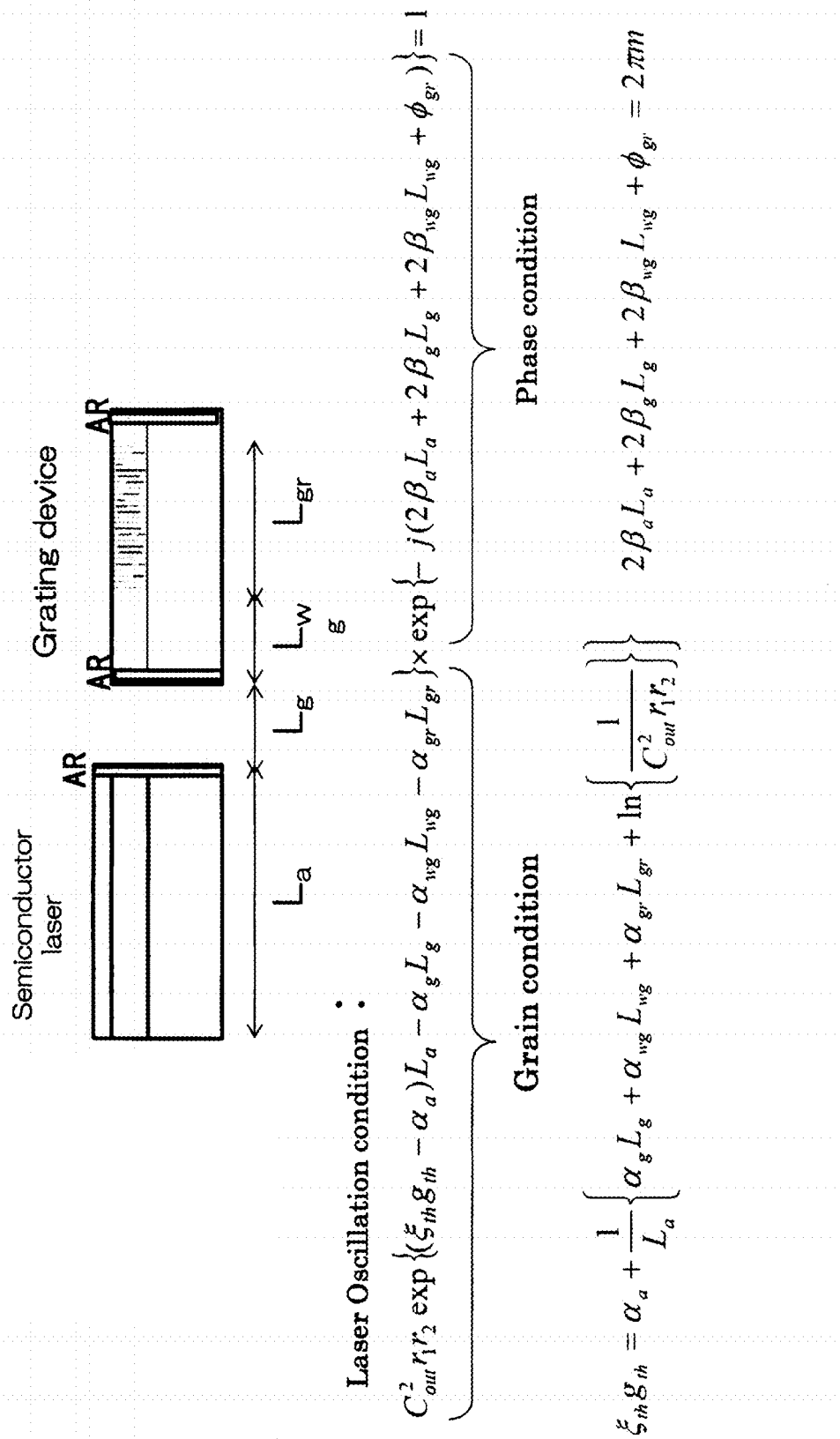
FIG. 15 illustrates a laser oscillation condition.

As illustrated in FIG. 15, the laser oscillation condition is determined by the gain condition and the phase condition. The wavelengths satisfying the phase condition are discrete as illustrated in, for example, FIG. 13. In particular, in the present structure, adjustment of the temperature coefficient of the the gain curve (0.3 nm/° C. in the case of GaAs) close to the temperature coefficient $d\lambda_G/dT$ of the grating can maintain the laser oscillation wavelength within $\Delta\lambda_G$. In addition, when 2 or more and 5 or less longitudinal modes are present within $\Delta\lambda_G$, the laser oscillation wavelength repeatedly exhibits mode-hopping within $\Delta\lambda_G$, which can reduce the possibility of production of laser oscillation outside of $\Delta\lambda_G$. This allows operation at a stable wavelength and with a stable output power without causing large mode hops.

In a suitable embodiment, the active layer has a length $L_a$ of 500 μm or less. In this regard, the active layer preferably has a length $L_a$ of 300 μm or less. To enhance the laser output, the active layer more preferably has a length $L_a$ of 150 μm or more.

$$\left| \frac{d\lambda_G}{dT} - \frac{d\lambda_{TM}}{dT} \right| \leq 0.03 \text{ nm/°C}. \quad (6)$$

In the Formula (6), $d\lambda_G/dT$ is the temperature coefficient of the Bragg wavelength.

$d\lambda_{TM}/dT$ is the temperature coefficient of the wavelengths satisfying the phase condition of the external resonator type laser.

In the formula, $\lambda_{TM}$ is a wavelength satisfying the phase condition of the external-resonator type laser, i.e., a wavelength satisfying the phase condition in the (Formula 2.3) described above. The wavelength is referred to as "longitudinal mode" in this specification.

Now, longitudinal modes will be described in detail.

Figure 13:
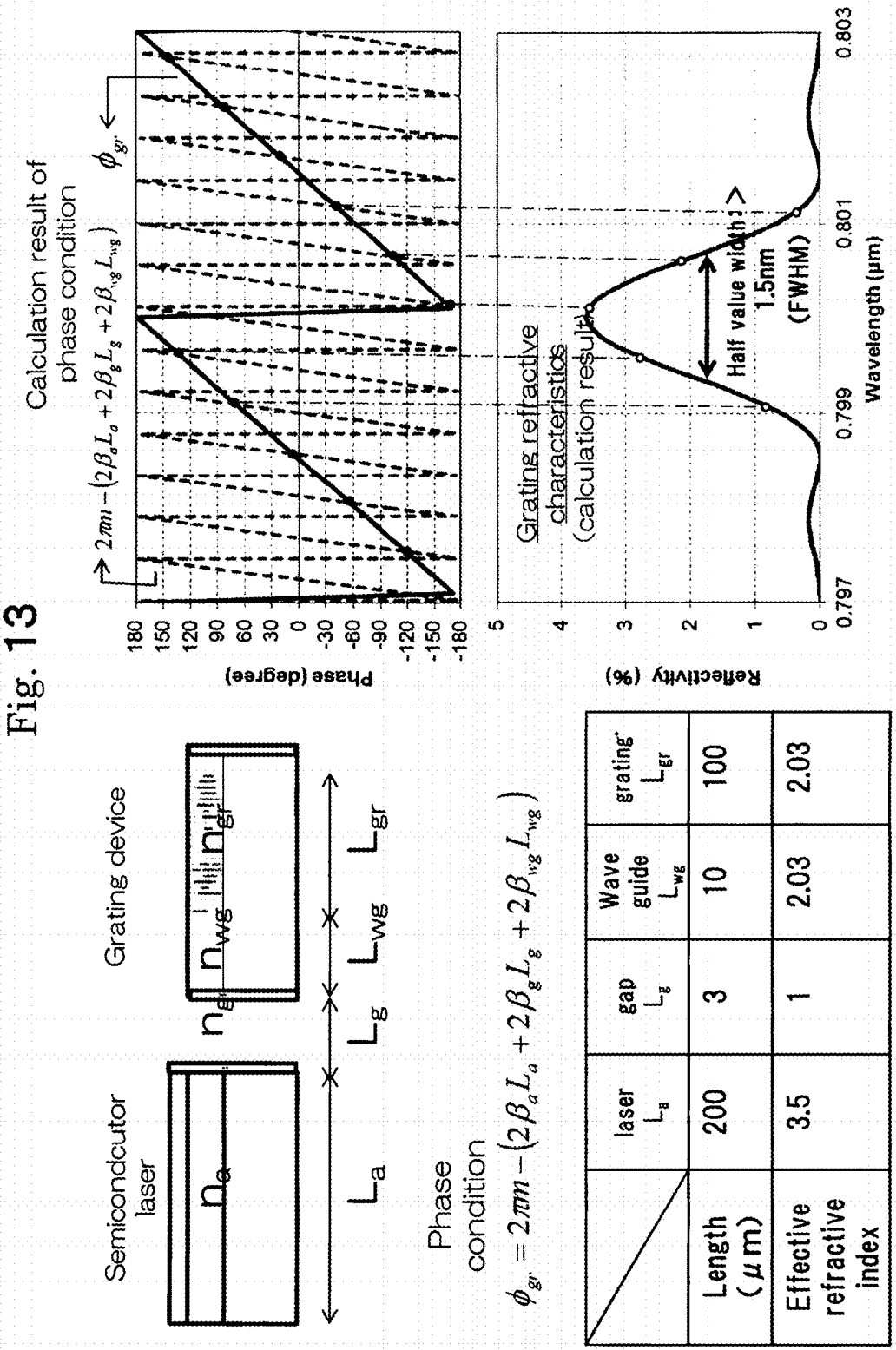
FIG. 13 illustrates an example of a discrete phase condition in the present invention.

In the Formula (2.3), β is equal to 2πneff/λ, wherein neff is the effective refractive index in the term, and λ satisfying this is $\lambda_{TM}$. φ2 is the phase change in the Bragg grating, and $\lambda_{TM}$ is illustrated in FIG. 13.

$\Delta G_{TM}$ is the spacing between the wavelengths satisfying the phase condition (longitudinal mode spacing) of the external resonator type laser. There are a plurality of $\lambda_{TM}$, and thus $\Delta G_{TM}$ is the difference between the plurality of $\lambda_{TM}$.

Thus, satisfaction of the Formula (6) results in increase in the temperature at which a mode hop occurs, which can actually prevent mode hops. The numerical value in the Formula (6) is more preferably 0.025 or less.

In a suitable embodiment, the grating device has a length $L_{WG}$ of 600 μm or less. $L_{WG}$ is preferably 400 μm or less and more preferably 300 μm or less. $L_{WG}$ is preferably 50 μm or more.

In a suitable embodiment, the distance $L_g$ between the light-emitting surface of the light source and the light-receiving surface of the optical waveguide is 1 μm or more and 10 μm or less. Such distance allows stable laser oscillation.

In a suitable embodiment, the propagating portion has a length $L_m$ of 100 μm or less. To decrease the length of the external resonator, the length $L_m$ is preferably 40 μm or less. This promotes stable laser oscillation. Although the lower limit of the length $L_m$ of the propagating portion is not critical, the length $L_m$ is preferably 10 μm or more and still more preferably 20 μm or more.

EXAMPLES

Example 1

The device 9 as illustrated in FIG. 1 and FIG. 2 was produced.

In particular, Ta2O5 was deposited at a thickness of 1.2 μm on a quartz substrate using a sputtering device to form a waveguide layer. Then, Ti was deposited on the Ta2O5, and a grating pattern was formed along the y-axis by photolithography. Then, grating grooves having a pitch spacing Λ of 232 nm and a length $L_b$ of from 5 to 100 μm, 300 μm, 500 μm, or 1000 μm were formed using the Ti pattern as a mask by reactive ion etching with fluorine based gases. The grating had a groove depth td of 20, 40, 60, 100, 160, 200, or 350 nm. To form an optical waveguide that causes light to propagate along the y-axis, grooves having a width Wm of 3 μm and Tr of 0.5 μm were formed by reactive ion etching in a manner similar to the manner described above.

Then, the resultant was cut into bars using a dicing device. The both end faces were optically polished, and then an AR coating having a reflectance of 0.1% was coated on the both end faces. Finally, the resultant was cut into chips to produce grating devices. The elements had a width of 1 mm and a length $L_{wg}$ of 500 μm.

With regard to the optical characteristics of the grating devices, the reflective characteristics were evaluated from the transmission characteristics by inputting TE mode light into the grating devices using a superluminescent diode (SLD), which is a broadband wavelength source, and analyzing the output light with an optical spectrum analyzer. All of the central reflective wavelengths of the measured elements were 945±1 nm.

Figure 8:
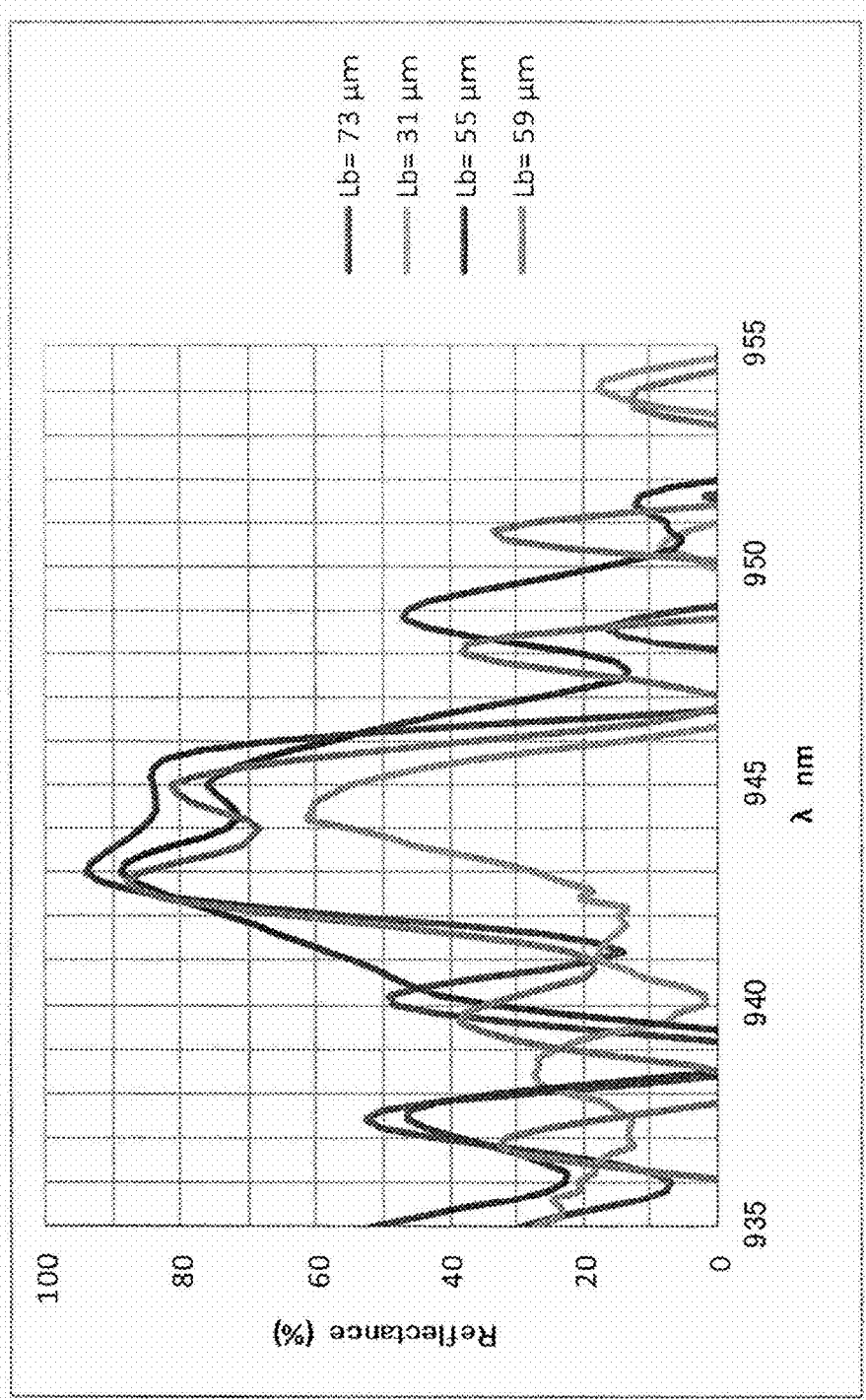
FIG. 8 illustrates results of reflective characteristics in Example 1.

FIG. 8 illustrates the results of the reflective characteristics at a grating length of from 30 μm to 70 μm when the groove depth td was 200 nm. The results indicate that a shorter grating length leads to a lower reflectance.

FIG. 9 illustrates the results of the reflectance and the width at half maximum of the reflectance at a grating length of from 10 μm to 1000 μm. The results indicate that the reflectance was 2% and the width at half was 7 nm at a grating length of 9 μm and that the reflectance was 3% or more (20%) and the width at half maximum was 6 nm or less (5 nm) at a grating length of 10 μm or more (17 μm).

FIG. 10 illustrates the reflectance and the width at half maximum at a grating length of 100 μm or more at a grating groove depth of 200 nm and 350 nm. The results indicate that the reflectance and the width at half maximum do not change and cannot be controlled at the depths and the lengths.

Figure 11:
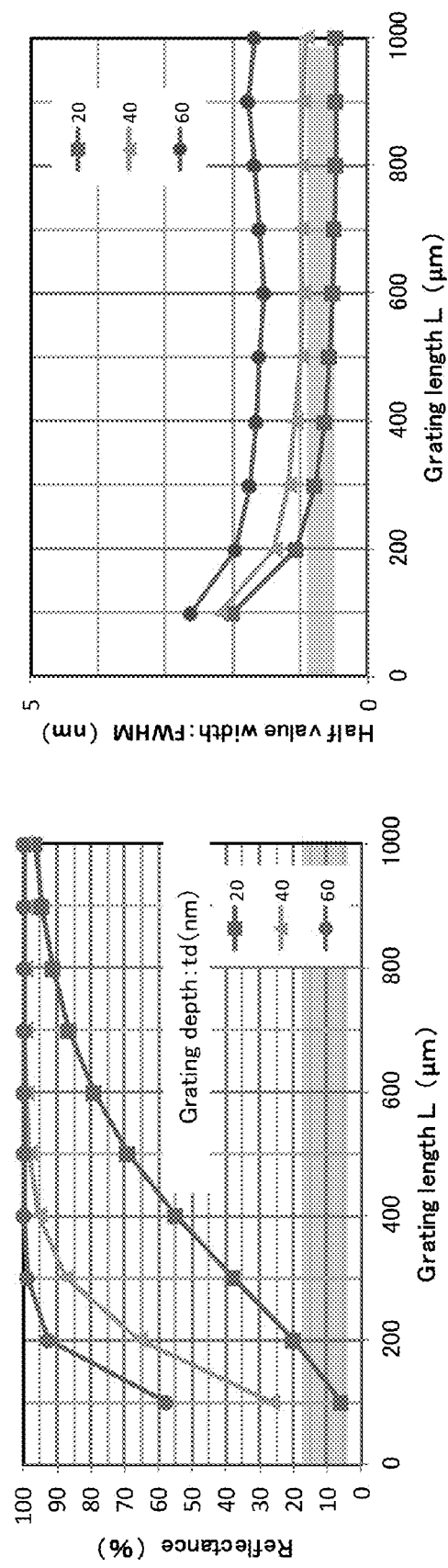
FIG. 11 illustrates results of reflectance and full width at half maximum at a grating length of from 50 to 1000 µm at a grating groove depth of 20, 40, and 60 nm in Example 1.

FIG. 11 illustrates the reflectance and the width at half maximum at a grating length of from 50 to 1000 μm at a grating groove depth of 20, 40, and 60 nm. It has been found that at the groove depth range, the reflectance can be controlled well by the grating length. The width at half maximum tended to monotonically increase at a grating length of 400 μm or less. At a depth of 20 nm, the width at half maximum was less than 0.8 nm at a grating length of 200 μm or more.

Example 2

Ti was deposited on a substrate of z-cut lithium niobate crystal doped with MgO, and a grating pattern was formed along the y-axis by photolithography. Then, grating grooves having a pitch spacing Λ of 214 nm and a length $L_b$ of 100 μm were formed using the Ti pattern as a mask by reactive ion etching with fluorine based gases. The grating had a groove depth of 20, 40, or 60 nm. To form an optical waveguide that causes light to propagate along the y-axis, grooves were formed in the grating by eximer laser so as to provide a width Wm of 3 μm and Tr of 0.5 μm. On the surface having the grooves formed therein, a buffer layer 16 of SiO2 was deposited at a thickness of 0.5 μm using a sputtering device. A black LN substrate, which was used as a support substrate, was bonded to the surface having the grating formed thereon.

Then, the resultant was attached to a polishing surface plate with the black LN substrate facing the surface plate, and the back side of the LN substrate having the grating formed thereon was finely polished to provide a thickness (Ts) of 1.2 μm. Then, the resultant was removed from the surface plate, and a buffer layer 17 of SiO2 was deposited at a thickness of 0.5 μm on the polished surface by sputtering.

The black LN refers to oxygen-deficient lithium niobate and can reduce pyroelectric generation of charges. Thus, when the temperature changes, cracking of the substrate can be reduced due to surge resistance.

Then, the resultant was cut into bars using a dicing device. The both end faces were optically polished, and then an AR coating having a reflectance of 0.1% was formed on the both end faces. Finally, the resultant was cut into chips to produce grating devices. The elements had a width of 1 mm and a length $L_{wg}$ of 500 μm.

With regard to the optical characteristics of the grating devices, the reflective characteristics were evaluated from the transmission characteristics by inputting TE mode light into the grating devices using a superluminescent diode (SLD), which is a broadband wavelength source, and analyzing the output light with an optical spectrum analyzer. The results are illustrated in FIG. 11.

The results indicate that LN and Ta2O5 provide substantially the same characteristics.

The devices exhibited a center wavelength of 945 nm, a maximum reflectance of 20%, and a full width at half maximum $\Delta\lambda_G$ of 2 nm with regard to TE mode light.

Example 3

Ti was deposited on a y-cut lithium niobate crystal substrate doped with MgO, and a grating pattern was formed along the x-axis by photolithography. Then, grating grooves having a pitch spacing $\Lambda$ of 224 nm and a length $L_b$ of 100 μm were formed using the Ti pattern as a mask by reactive ion etching with fluorine based gases. The grating had a groove depth of 20, 40, or 60 nm. To form an optical waveguide that causes light to propagate along the x-axis, grooves were formed in the grating by eximer laser so as to provide a width Wm of 3 μm and Tr of 0.5 μm. And on the surface having the grooves formed therein, a buffer layer 16 of SiO2 was deposited at a thickness of 0.5 μm using a sputtering device. A black LN substrate, which was used as a support substrate, was bonded to the surface having the grating formed thereon.

Then, the resultant was attached to a polishing platen with the black LN substrate facing the platen, and the back side of the LN substrate having the grating formed thereon was finely polished to provide a thickness (Ts) of 1.2 μm. Then, the resultant was removed from the platen, and a buffer layer 17 of SiO2 was deposited at a thickness of 0.5 μm on the polished surface by sputtering.

Then, the resultant was cut into bars using a dicing device. The both end faces were optically polished, and then an AR coating having a reflectance of 0.1% was formed on the both end faces. Finally, the resultant was cut into chips to produce grating devices. The elements had a width of 1 mm and a length $L_{wg}$ of 500 μm.

Figure 12:
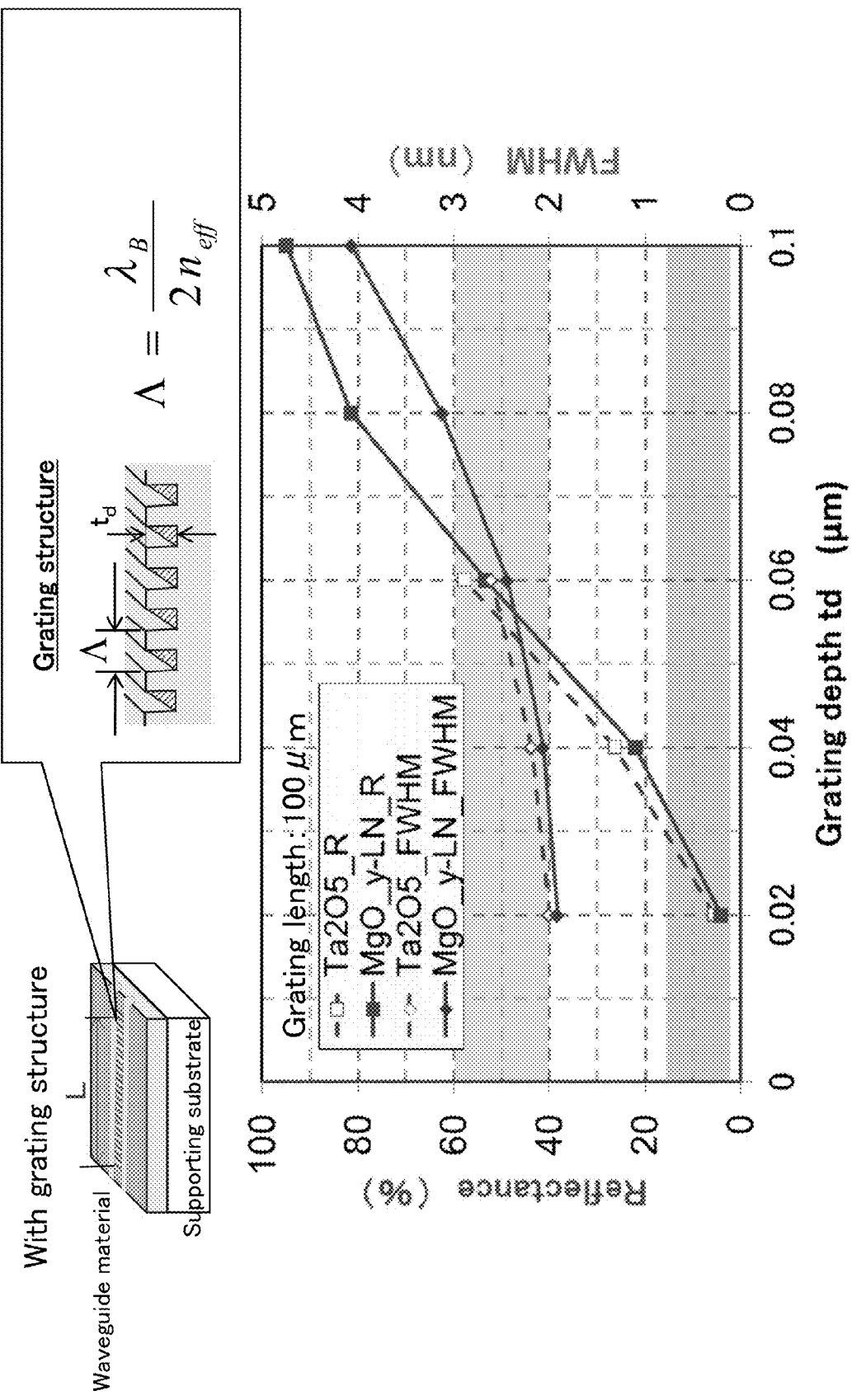
FIG. 12 illustrates reflective characteristics in Example 3.

With regard to the optical characteristics of the grating devices, the reflective characteristics were evaluated from the transmission characteristics by inputting TE mode light into the grating devices using a superluminescent diode (SLD), which is a broadband wavelength source, and analyzing the output light with an optical spectrum analyzer. The results are illustrated in FIG. 12.

The results indicate that the devices in Examples 1 to 3 had the same reflectance and full width at half maximum and that LN and Ta2O5 provide the same reflectance and full width at half maximum. The devices exhibited a center wavelength of 945 nm, a maximum reflectance of 20%, and a full width at half maximum $\Delta\lambda_G$ of 2 nm with regard to TE mode light.

It has been also found that even when the wavelength changes, the elements exhibit substantially the same reflectance and the same full width at half maximum at a wavelength in the range of from 600 nm to 1.55 μm.

Example 4

The device as illustrated in FIG. 4 was produced.

In particular, Ti was deposited on a substrate of z-cut lithium niobate crystal doped with MgO, and a grating pattern was formed along the y-axis by photolithography. Then, grating grooves having a pitch spacing $\Lambda$ of 214 nm and a length $L_b$ 100 μm were formed using the Ti pattern as a mask by reactive ion etching with fluorine based gases. The grating had a groove depth of 40 nm. To form an optical waveguide that causes light to propagate along the y-axis, grooves were formed in the grating by eximer laser so as to provide a width Wm of 3 μm and Tr of 0.5 μm. On the surface having the grooves formed therein, a buffer layer 16 of SiO2 was deposited at a thickness of 0.5 μm using a sputtering device. A black LN substrate, which was used as a support substrate, was bonded to the surface having the grating formed thereon.

Then, the resultant was attached to a polishing platen with the black LN substrate facing the platen, and the back side of the LN substrate having the grating formed thereon was finely polished to provide a thickness (Ts) of 1.2 μm. Then, the resultant was removed from the platen, and a buffer layer 17 of SiO2 was deposited at a thickness of 0.5 μm on the polished surface by sputtering.

Then, the resultant was cut into bars using a dicing device. The both end faces were optically polished, and then an AR coating having a reflectance of 0.1% was formed on the both end faces. Finally, the resultant was cut into chips to produce a grating devices. The element had a width of 1 mm and a length $L_{wg}$ of 500 μm.

With regard to the optical characteristics of the grating device, the reflective characteristics were evaluated from the transmission characteristics by inputting TE mode light into the grating device using a superluminescent diode (SLD), which is a broadband wavelength source, and analyzing the output light with an optical spectrum analyzer. The results indicate that the device exhibited a center wavelength of 945 nm, a maximum reflectance of 20%, and a full width at half maximum $\Delta\lambda_G$ of 2 nm with regard to TE mode light.

To evaluate the characteristics of an external resonator type laser that uses the grating device, a laser module was formed as illustrated in FIG. 1. A light source element was prepared, the device including a GaAs-based laser structure, a high reflective coating on one end face, and an AR coating having a reflectance of 0.1% deposited on the other end face.

Figure 14:
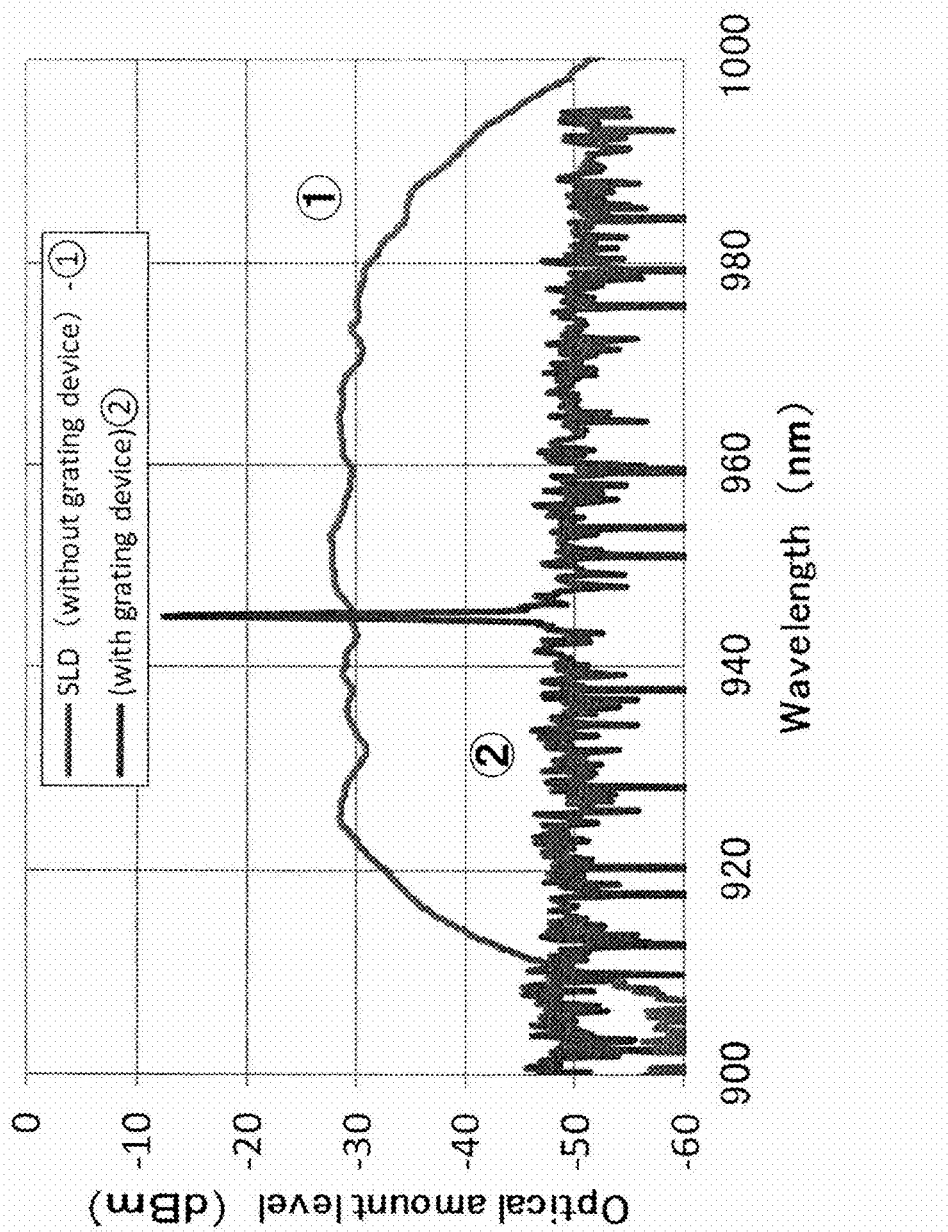
FIG. 14 illustrates the spectrum of the light power of a light source and the spectrum of a device obtained by adding a grating device to the light source in Example 4.

Specification of Light Source Device:
Center wavelength: 950 nm
Output: 20 mW
Full width at half maximum: 50 nm
Length of laser device: 250 μm
Mounting Specification:
Lg: 1 μm
Lm: 20 μm After formation of the module, the module was operated using current control (ACC) without using a Peltier device. The module exhibited a center wavelength of 945 nm and an output of 50 mW. The spectral characteristics of the laser is illustrated in FIG. 14. To evaluate the range of the operating temperature, the module was placed in a constant temperature bath, and the temperature dependence of the laser oscillation wavelength and the variation in the output were measured. The results indicate that the temperature coefficient of the laser oscillation wavelength was 0.05 nm/° C., the temperature range at which the variation in the output became large due to mode hopping was 80° C., and the variation in power output at the temperature was 1% or less even when mode hop occurred.

When TM light was input into the device, and the similar experiments were conducted, then the module produced laser light at a wavelength of 907 nm, and the temperature coefficient of the laser oscillation wavelength was 0.1 nm/° C. It was confirmed that the temperature at which the variation in the output became large due to mode hopping was increased to 100° C., and the variation in power output at the temperature was 1% or less even when mode hop occurred.

This is attributed to the fact that the change in the refractive index with temperature along the z-axis is larger than the change along the y-axis and the z-axis, in the case of use of LN crystal.

Example 5

Grating grooves having a pitch spacing $\Lambda$ of 222 nm and a length $L_b$ of 100 μm were formed in the same manner as in the Example 4. The grating had a groove depth of 40 nm. With regard to the optical characteristics of the grating device, the reflective characteristics were evaluated from the transmission characteristics by inputting light into the grating device using a superluminescent diode (SLD), which is a broadband wavelength source, and analyzing the output light with an optical spectrum analyzer. The results indicate that the element exhibited a center wavelength of 975 nm, a maximum reflectance of 20%, and a full width at half maximum $\Delta\lambda_G$ of 2 nm with regard to TE mode light.

Then, a laser module was formed as illustrated in FIG. 5. The light source device included a typical GaAs-based laser and includes no AR coating on the emitting end-face.

Specification of Light Source Device:
Center wavelength: 977 nm
Output: 50 mW
Full width at half maximum: 0.1 nm
Length of laser device: 250 μm
Mounting Specification:
Lg: 1 μm
Lm: 20 μm After formation of the module, the module was operated using current control (ACC) without using a Peltier device. The module exhibited a center wavelength of 975 nm, which corresponded to the reflection wavelength of the grating, and an output of 40 mW, which was smaller compared with the module without a grating device. To evaluate the range of the operating temperature, the module was placed in a constant temperature bath, and the temperature dependence of the laser oscillation wavelength and the variation in the output were measured. The results indicated that the temperature coefficient of the laser oscillation wavelength was 0.05 nm/° C., the temperature range at which the variation in the output became large due to mode hopping was 80° C., and the variation in power output at the temperature was 1% or less even when mode hop occurred.

Comparative Example

In the Example 5, the module without a grating device exhibited a higher temperature coefficient of the laser oscillation wavelength of 0.3 nm/° C. and a temperature at which mode hop occurred of about 10° C. At 10° C. or more, the variation in power was large, and the variation in the output was 10% or more.

Example 6

Ta2O5 was deposited at a thickness of 1.2 μm on a quartz substrate using a sputtering device to form a waveguide layer. Then, Ni was deposited on the Ta2O5, and a grating pattern was formed along the y-axis by photolithography. Then, grating grooves having a pitch spacing $\Lambda$ of 232 nm and a length $L_b$ of 100 μm were formed using the Ni pattern as a mask by reactive ion etching with fluorine based gases.

The grating had a groove depth of 40 nm. Then, an optical waveguide having a configuration illustrated in FIG. 2 and FIG. 3 was formed by reactive ion etching in a manner similar to the manner described above. With regard to the optical characteristics of the grating device, the reflective characteristics were evaluated from the transmission characteristics by inputting light into the grating device using a superluminescent diode (SLD), which is a broadband wavelength source, and analyzing the output light with an optical spectrum analyzer. The results indicated that the element exhibited a center wavelength of 945 nm, a maximum reflectance of 20%, and a full width at half maximum $\Delta\lambda_G$ of 2 nm with regard to TE mode.

Then, a laser module was formed as illustrated in FIG. 1. The light source device included a typical GaAs-based laser and an AR coating having a reflectance of 0.1% deposited on the emitting end-face.

Specification of Light Source Device:
Center wavelength: 950 nm
Output: 20 mW
Full width at half maximum: 50 nm
Length of laser device: 250 μm
Mounting Specification:
Lg: 1 μm
Lm: 20 μm After formation of the module, the module was operated using current control (ACC) without using a Peltier element. The module exhibited a center wavelength of 945 nm, which corresponded to the reflection wavelength of the grating, and an output of 50 mW. To evaluate the range of the operating temperature, the module was placed in a constant temperature bath, and the temperature dependence of the laser oscillation wavelength and the variation in the output were measured. The results indicate that the temperature coefficient of the laser oscillation wavelength was 0.03 nm/° C., the temperature at which the variation in the output became large due to mode hopping was 50° C., and the variation in the power output at the temperature was 1% or less even when mode hop occurred.

Example 7

Ta2O5 was deposited at a thickness of 2 μm on a quartz support-substrate 10 using a sputtering device to form a waveguide layer 11. Then, Ni was deposited on the Ta2O5 waveguide layer 11, and a grating pattern was formed along the y-axis by photolithography. Then, grating grooves having a pitch spacing $\Lambda$ of 228 nm and a length $L_b$ of 100 μm were formed using the Ni pattern as a mask by reactive ion etching with fluorine based gases. The grating had a groove depth of 140 nm.

Then, an optical waveguide 18 having a configuration illustrated in FIG. 2 and FIG. 3 was formed by reactive ion etching in a manner similar to the manner described above. With regard to the optical characteristics of the grating device, the reflective characteristics were evaluated from the transmission characteristics by inputting light into the grating device using a superluminescent diode (SLD), which is a broadband wavelength source, and analyzing the output light with an optical spectrum analyzer. The results indicated that the device exhibited a center wavelength of 945 nm, a maximum reflectance of 20%, and a full width at half maximum $\Delta\lambda_G$ of 2 nm with regard to TE mode light.

In addition, reflection peaks were observed at a plurality of shorter wavelengths.

As a result of a simulation for investigating the cause, it has been found that the transverse mode of light that exits the optical waveguide is of multiple mode. Thus, it can be presumed that the multi-mode light has a lower effective refractive index and a lower equivalent refractive index compared with those of the fundamental mode light, and thus a reflection peak derived from the multi-mode is shown at a shorter wavelength. To empirically confirm the presumption, the near field patterns of the optical waveguide were observed. The results indicate that fundamental mode was excited, while misalignment excites the multi-mode. Thus it could be confirmed that the waveguide is a multi-mode waveguide.

Then, a laser module was formed as illustrated in FIG. 5. The light source device included a typical GaAs-based laser and included no AR coating on the emitting end-face.

Specification of Light Source Device:
Center wavelength: 977 nm
Output: 50 mW
Full width at half maximum: 0.1 nm
Length of laser device: 250 μm
Mounting Specification:
Lg: 1 μm
Lm: 20 μm After formation of the module, the module was operated using current control (ACC) without using a Peltier element. The module exhibited a center wavelength of 975 nm, which corresponded to the reflection wavelength of the grating. The transverse mode of the laser light emitted from the module was of fundamental mode. The output of the laser light was 40 mW, which was smaller compared with that of the module without a grating device. To evaluate the range of the operating temperature, the module was placed in a constant temperature bath, and the temperature dependence of the laser oscillation wavelength and the variation in the output were measured. The results indicate that the temperature coefficient of the oscillation wavelength was 0.03 nm/° C., the temperature at which the variation in the output became large due to mode hopping was 50° C., and the variation in the power output at the temperature was 1% or less even when mode hop occurred.

The invention claimed is:

1. An external resonator type light emitting system comprising a light source emitting a semiconductor laser light and a grating device constituting an external resonator with said light source,
    wherein said light source comprises an active layer emitting said semiconductor laser light, and
    wherein said grating device comprises:
    a support substrate;
    an optical material layer disposed on said support substrate and having a thickness of 0.5 μm or more and 3.0 μm or less;
    a ridge optical waveguide formed by a pair of ridge grooves in said optical material layer and comprising a light-receiving surface for receiving a semiconductor laser light and a light-emitting surface for emitting a light having a desired wavelength;
    a Bragg grating comprising convexes and concaves formed in said ridge optical waveguide; and
    a propagating portion disposed between said light-receiving surface and said Bragg grating,
    wherein a transverse mode of said ridge optical waveguide is of multi-mode,
    wherein a transverse mode of said laser light emitted from said external resonator type light emitting system is of fundamental mode, and
    wherein relationships represented by the following Formulas (1) to (5) are satisfied:

$$0.8 \text{ nm} \leq \Delta\lambda_G \leq 6.0 \text{ nm} \quad (1)$$

$$10 \text{ μm} \leq L_b \leq 300 \text{ μm} \quad (2)$$

$$20 \text{ nm} \leq td \leq 250 \text{ nm} \quad (3)$$

$$n_b \geq 1.8 \quad (4)$$

$$L_{WG} \leq 500 \text{ μm} \quad (5)$$

wherein $\Delta\lambda_G$ in the Formula (1) is a full width at half maximum of a peak Bragg reflectance,
wherein $L_b$ in the Formula (2) is a length of said Bragg grating,
wherein td in the Formula (3) is a depth of said convexes and concaves constituting said Bragg grating,
wherein $n_b$ in the Formula (4) is a refractive index of said material constituting said Bragg grating, and
wherein $L_{WG}$ in the formula (5) is a length of said grating device.

2. The system of claim 1, wherein a ratio $(T_r/T_s)$ of a depth $T_r$ of said ridge groove to a thickness $T_s$ of said optical material layer is 0.4 or more and 0.9 or less.

3. The system of claim 1, wherein said material forming said Bragg grating is selected from the group consisting of gallium arsenide, lithium niobate single crystal, tantalum oxide, zinc oxide and aluminum oxide.

4. The system of claim 1, wherein 2 or more and 5 or less wavelengths satisfying phase condition for laser oscillation exist within said full width at half maximum $\Delta\lambda_G$.

5. The system of claim 1, wherein relationship represented by the following Formula (6) is satisfied:

$$\left| \frac{d\lambda_G}{dT} - \frac{d\lambda_{TM}}{dT} \right| \leq 0.03 \text{ nm/°C.} \quad (6)$$

wherein $d\lambda_G/dT$ in the formula (6) is a temperature coefficient of a Bragg wavelength, and
wherein $d\lambda_{TM}/dT$ is a temperature coefficient of a wavelength satisfying phase matching condition of an external resonator laser.

6. The system of claim 1, wherein said external resonator type light emitting system operates in a single mode.

7. The system of claim 1, wherein said multi-mode comprises said fundamental mode and higher order mode;
    wherein a reflection wavelength of said fundamental mode is distant from a reflection wavelength of said higher order mode by 3 nm or larger;
    wherein a ratio $(T_r/T_s)$ of a depth $T_r$ of said ridge groove to a thickness $T_s$ of said optical material layer is 0.55 or more and 0.9 or less; and
    wherein said full width at half maximum of said peak Bragg reflectance $\Delta\lambda_G$ is 5 nm or smaller.

8. The system of claim 7, wherein said light source oscillates said semiconductor laser light by itself.

9. The system of claim 7, wherein said semiconductor laser light oscillated by said light source has a wavelength of 780 nm or longer and 990 nm or shorter.

* * * * *